(12) United States Patent
Kawai et al.

(10) Patent No.: US 9,524,776 B2
(45) Date of Patent: Dec. 20, 2016

(54) FORMING METHOD FOR VARIABLE-RESISTANCE NONVOLATILE MEMORY ELEMENT

(71) Applicant: Panasonic Intellectual Property Management Co., Ltd., Osaka (JP)

(72) Inventors: Ken Kawai, Osaka (JP); Koji Katayama, Nara (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/130,939

(22) Filed: Apr. 16, 2016

(65) Prior Publication Data

US 2016/0322103 A1 Nov. 3, 2016

(30) Foreign Application Priority Data

Apr. 28, 2015 (JP) ................................. 2015-092347

(51) Int. Cl.
*G11C 11/00* (2006.01)
*G11C 13/00* (2006.01)

(52) U.S. Cl.
CPC ....... *G11C 13/0069* (2013.01); *G11C 13/0002* (2013.01); *G11C 2013/0083* (2013.01)

(58) Field of Classification Search
CPC ............. G11C 13/0069; G11C 13/0007; G11C 2013/0083; G11C 2213/79; G11C 13/0064; G11C 2013/0073; G11C 2213/32; G11C 13/004; G11C 2013/0092; G11C 2213/15; G11C 2213/56; G11C 2013/0054; G11C 2013/009; G11C 11/5685

See application file for complete search history.

(56) References Cited

U.S. PATENT DOCUMENTS 8,411,486 B2* 4/2013 Sekine ................ G11C 11/5685
365/100
8,902,629 B2* 12/2014 Kawai .................. H01L 27/101
365/148

(Continued)

FOREIGN PATENT DOCUMENTS

JP 2006-351780 12/2006
JP 2007-004873 1/2007
WO 2012/042866 4/2012

OTHER PUBLICATIONS

I.G.Baek et al., "Highly Scalable Non-volatile Resistive Memory using Simple Binary Oxide Driven by Asymmetric Unipolar Voltage Pulses", IEEE, IEDM pp. 587-590, 2004.

(Continued)

*Primary Examiner* — Hien Nguyen
(74) *Attorney, Agent, or Firm* — McDermott Will & Emery LLP

(57) ABSTRACT

A forming method includes: applying a first pulse voltage to a second electrode to a variable-resistance nonvolatile memory element in first state; and executing at least once a sequence that includes determining whether the variable-resistance nonvolatile memory element is in a second state, and continuously applying a second pulse voltage followed by a third pulse voltage to the variable-resistance nonvolatile memory element when the variable-resistance nonvolatile memory element is determined not to be in the second state.

16 Claims, 13 Drawing Sheets

(56) References Cited

U.S. PATENT DOCUMENTS

| | | | |
|---|---|---|---|
| 2010/0054017 A1* | 3/2010 | Maejima | G11C 13/0011 |
| | | | 365/148 |
| 2011/0069530 A1 | 3/2011 | Sekine et al. | |
| 2011/0110143 A1* | 5/2011 | Kanzawa | G11C 13/0007 |
| | | | 365/148 |
| 2011/0110144 A1 | 5/2011 | Kawai et al. | |
| 2012/0230085 A1 | 9/2012 | Kawai et al. | |
| 2013/0044534 A1 | 2/2013 | Kawai et al. | |

OTHER PUBLICATIONS

T.Ninomiya et al., "Conductive Filament Scaling of TaOx Bipolar ReRAM for Long Retention with Low Current Operation", 2012 Symposium on VLSI Technology Digest of Technical Papers.

* cited by examiner

FIG. 6

| OPERATION MODE / NODE | FORMING | | | NORMAL OPERATION | | |
|---|---|---|---|---|---|---|
| | POSITIVE PULSE VOLTAGE APPLICATION | NEGATIVE PULSE VOLTAGE APPLICATION | READING | WRITING OF "0" POSITIVE PULSE VOLTAGE APPLICATION | WRITING OF "1" NEGATIVE PULSE VOLTAGE APPLICATION | READING |
| WL | VDDIO (3.3 V) | VDDIO (3.3 V) | VDD (1.8 V) | VL (2.4 V) | VL (2.4 V) | VDD (1.8 V) |
| SL | 0 V | VLb | 0 V | 0 V | VL (2.4 V) | 0 V |
| BL | VHb/VHr ⎍ 0 V | VLb ⎌ 0 V | Vread (0.4 V) | VH ⎍ 0 V | VL ⎌ 0 V | Vread (0.4 V) |

FORMING METHOD FOR VARIABLE-RESISTANCE NONVOLATILE MEMORY ELEMENT

BACKGROUND

1. Technical Field

The present disclosure relates to a forming method for a variable-resistance nonvolatile memory element of which resistance value reversibly changes in response to an electric signal, and a variable-resistance nonvolatile memory device.

2. Description of the Related Art

A variable-resistance nonvolatile memory device that includes a memory cell constituted by a variable-resistance nonvolatile memory element (hereinafter also simply referred to as a "variable-resistance element") is now being developed (refer to, for example, Japanese Laid-open Patent Publication No. 2006-351780, I. G. Baek et al. IEDM 2004, p. 587, and, T. Ninomiya et al., VLSI 2012, p. 74).

The variable-resistance element is an element having a resistance value that is reversibly changeable in response to an electric signal, and is capable of storing data in a nonvolatile manner based on the resistance values.

SUMMARY

One non-limiting and exemplary embodiment provides a forming method for a variable-resistance nonvolatile memory element that can achieve a reduced degradation of a retention characteristic, and a variable-resistance nonvolatile memory device.

A forming method according to an aspect of the present disclosure comprises: (A) applying a first pulse voltage to a variable-resistance nonvolatile memory element in a first state, the first pulse voltage having a first polarity; and (B) executing at least once a sequence that includes (b1) determining whether the variable-resistance nonvolatile memory element is in a second state, and (b2) continuously applying a second pulse voltage followed by a third pulse voltage to the variable-resistance nonvolatile memory element when the variable-resistance nonvolatile memory element is not in the second state, the second pulse voltage having a second polarity which is reverse to the first polarity, the third pulse voltage having the first polarity. The variable-resistance nonvolatile memory element is irreversibly changeable from the first state to the second state, a resistance value of the variable-resistance nonvolatile memory element being larger in the first state than in the second state. The variable-resistance nonvolatile memory element has, in the second state, such a reversible resistance change characteristic that the resistance value decreases in response to application of a fourth pulse voltage and increases in response to application of a fifth pulse voltage, the fourth pulse voltage having the first polarity, the fifth pulse voltage having the second polarity. An amplitude of the second pulse voltage is larger than an amplitude of the fifth pulse voltage.

Forming method for variable-resistance nonvolatile memory element of the present disclosure can reduce degradation of the retention characteristic of the variable-resistance nonvolatile memory element.

It should be noted that comprehensive or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6 is an exemplary table of set voltages in modes according to the first embodiment;

DETAILED DESCRIPTION

Underlying Knowledge Forming Basis of the Present Disclosure

Initialization processing, called forming, is carried out on a variable-resistance element, after manufacturing thereof. The forming changes the variable-resistance element from an initial state to a variable resistance state. The variable-resistance element in the initial state has an extremely high resistance value close to that of an insulator. The variable-resistance element in the variable resistance state is reversibly changeable between a high resistance state and a low resistance state in response to a pulse application, for example. The variable-resistance element in the initial state does not exhibit this reversible resistance change. The forming includes an application of a predetermined forming voltage between electrodes of the variable-resistance element. This application of the forming voltage forms a filament (i.e., conduction path) inside the variable-resistance element.

Figure 10:
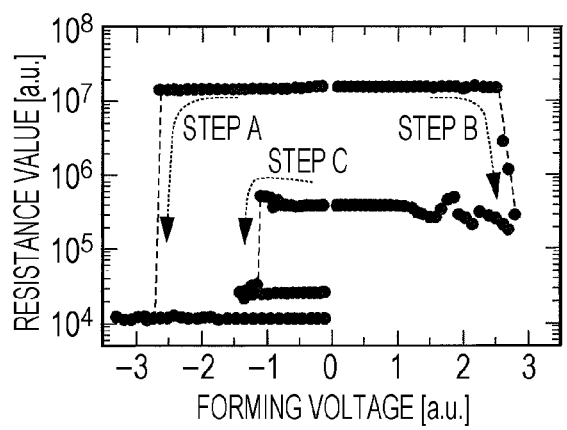
FIG. 10 is an R-V characteristic diagram of a variable-resistance element according to a reference example.

FIG. 10 illustrates an exemplary R-V characteristic when a forming pulse voltage is sequentially applied to the variable-resistance element in the initial state. FIG. 10 illustrates two forming methods of one-step forming and two-step forming.

In the example in FIG. 10, the one-step forming only involves Step A of applying a negative pulse voltage. The two-step forming involves Step B of applying a positive pulse voltage and Step C of applying a negative pulse voltage after Step B. The negative pulse voltage has the same polarity as that of a voltage for changing the variable-resistance element from the high resistance state to the low resistance state, and the positive pulse voltage has the same polarity as that of a voltage for changing the variable-resistance element from the low resistance state to the high resistance state.

In FIG. 10, an amplitude of the negative pulse voltage in Step C of the two-step forming is lower than an amplitude of the negative pulse voltage in Step A of the one-step forming. Thus, in the two-step forming, lower current flows through the variable-resistance element in response to the negative pulse voltage application than in the one-step forming, thereby reducing an increase in the size of the filament.

Figure 11:
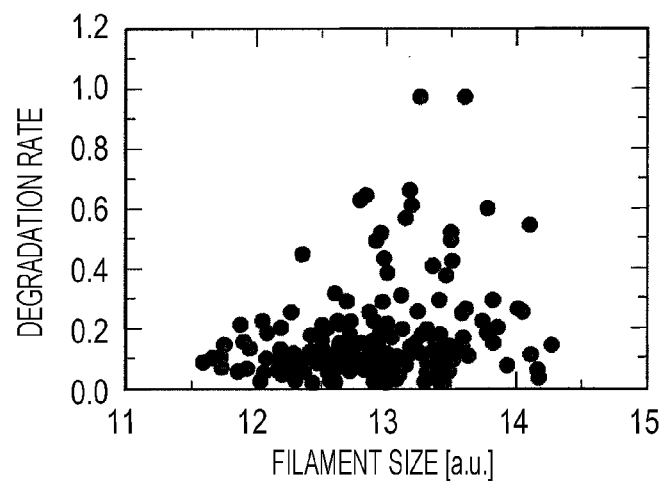
FIG. 11 illustrates dependency of a degradation rate of retention on the size of a filament in the variable-resistance element according to the reference example.
Figure 12:
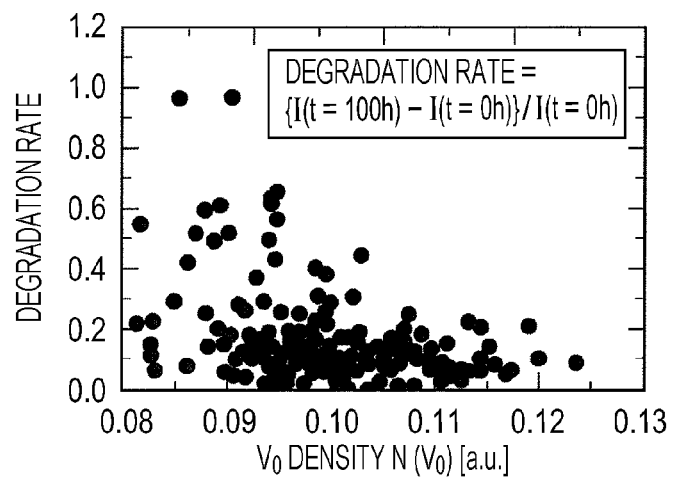
FIG. 12 illustrates dependency of the degradation rate of retention on an oxygen defect density in the variable-resistance element according to the reference example.

FIG. 11 illustrates dependency of a degradation rate of retention in the low resistance state on the size of the filament in the variable-resistance element. FIG. 12 illustrates dependency of the degradation rate of retention in the low resistance state on an oxygen defect density of the variable-resistance element. FIGS. 11 and 12 indicate that the degradation rate of retention in the low resistance state is reduced when the size of the filament is small and the oxygen defect density is high. The inventors carried out a further discussion on the two-step forming, and have reached a forming method according to the present disclosure. The following first describes the configuration of a variable-resistance nonvolatile memory device used as a study example, and thereafter describes a problem focused on by the inventors.

The variable-resistance nonvolatile memory device according to the study example includes a plurality of memory cells each including a variable-resistance element and a switch element. The memory cells are arranged in an array.

Figure 13:
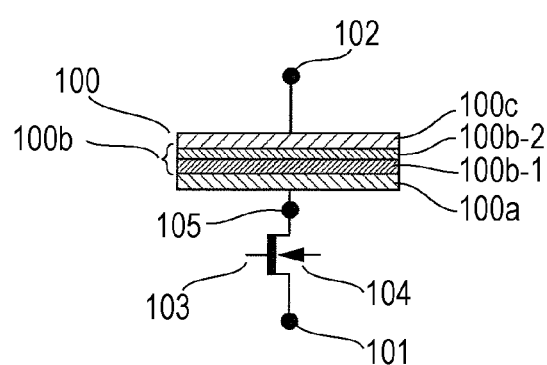
FIG. 13 is a pattern diagram of the configuration of a 1T1R memory cell including a variable-resistance element according to a study example.

FIG. 13 is a pattern diagram of the configuration of a 1T1R memory cell, and the 1T1R memory cell includes an NMOS transistor 104 and a variable-resistance element 100.

As illustrated in FIG. 13, the variable-resistance element 100 includes a stack of a lower electrode 100a, a variable-resistance layer 100b, and an upper electrode 100c in this order. The variable-resistance layer 100b includes a first tantalum oxide layer 100b-1 made of oxygen-deficient tantalum oxide ($TaO_{1.54}$), and a second tantalum oxide layer 100b-2 made of tantalum oxide ($Ta_2O_5$). A lower electrode terminal 105 extends from the lower electrode 100a, and an upper electrode terminal 102 extends from the upper electrode 100c.

The NMOS transistor 104 as a selection transistor includes a gate terminal 103. The lower electrode terminal 105 of the variable-resistance element 100 and one of N+ diffusion regions of the NMOS transistor 104 are connected with each other in series. A lower electrode terminal 101 extends from the other N+ diffusion region of the NMOS transistor 104 and is connected with the ground potential. The second tantalum oxide layer 100b-2 is disposed closer to the upper electrode terminal 102 than the first tantalum oxide layer 100b-1.

In the 1T1R memory cell according to the study example, the area of the variable-resistance layer 100b in a plan view was 0.25 $\mu m^2$ (=0.5 $\mu m \times 0.5$ $\mu m$). The first tantalum oxide layer 100b-1 was made of $TaO_{1.54}$, and had a film thickness of 44.5 nm. The second tantalum oxide layer 100b-2 was made of $TaO_{2.47}$, and had a film thickness of 5.5 nm. The upper electrode 100c contained Ir as a primary component, and the lower electrode 100a contained tantalum nitride TaN as a primary component.

The variable-resistance layer 100b is formed by sputtering. Then, a region of the variable-resistance layer 100b is subjected to plasma oxidation processing, thereby becoming the second tantalum oxide layer 100b-2 while the remaining region becomes the first tantalum oxide layer 100b-1. Accordingly, the second tantalum oxide layer 100b-2 has a high oxygen content and an extremely high resistance value (>1 MΩ) as compared to the first tantalum oxide layer 100b-1. Thus, a predetermined negative pulse voltage is required to be applied to form a conduction path so that the variable-resistance element 100 can operate in a resistance change manner.

The present disclosure employs the two-step forming to achieve a low negative pulse voltage. Forming according to the study example includes a first step, a second step, and a verifying step.

In the first step, a pulse voltage of +3.3 V was applied to the upper electrode terminal 102 once for a predetermined duration while 0 V was applied to the lower electrode terminal 101 and 3.3 V was applied to the gate terminal 103. As a result, an oxygen-deficiency region was formed in the second tantalum oxide layer 100b-2. In the second step, while the upper electrode terminal 102 was maintained at 0 V and the gate terminal 103 was maintained at 3.3 V, a pulse voltage having a pulse width of 100 ns and a voltage of −1.4 V was applied once to the lower electrode terminal 101.

In the following, the amplitude of a positive pulse voltage applied in the first step is also referred to as a positive forming voltage VHb, and the amplitude of a negative pulse voltage applied in the second step is also referred to as a negative forming voltage VLb. With these notations, the positive pulse voltage is +VHb, and the negative pulse voltage is −VLb.

In the verifying step, a voltage of 0 V was applied to the lower electrode terminal 101, a voltage of 1.8 V was applied to the gate terminal 103, and a voltage of 0.4 V approximately was applied to the upper electrode terminal 102. The forming was determined to be complete if a current equal to or larger than a predetermined value flowed through the 1T1R memory cell, and incomplete if a current equal to or larger than the predetermined value did not flow through the 1T1R memory cell. If the forming was incomplete, the same sequence was repeated with increment of the negative forming voltage VLb by 0.1 V until the forming was complete or the negative forming voltage VLb became 2.8 V.

Figure 14:
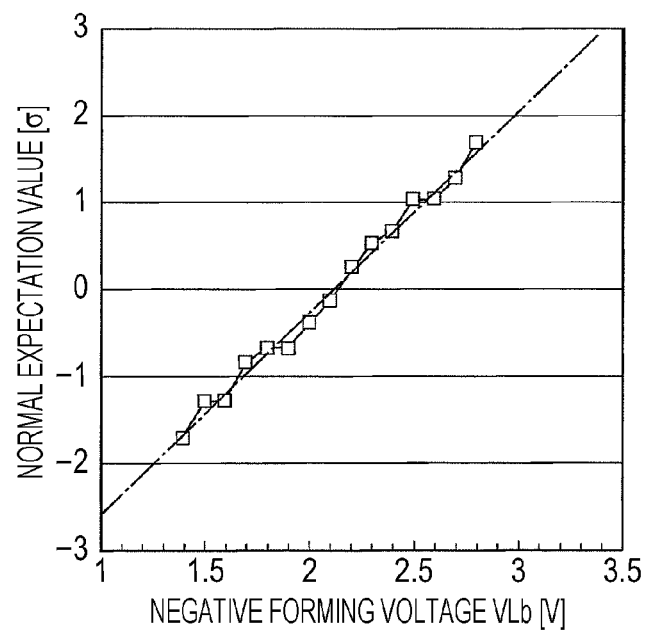
FIG. 14 is a distribution diagram of the normal expectation value of the negative forming voltage in the variable-resistance element according to the study example.

FIG. 14 is a characteristic diagram illustrating a relation between the negative forming voltage VLb and a normal expectation value when the two-step forming is performed on a set of 20 memory cells included in the variable-resistance nonvolatile memory device according to the study example.

In FIG. 14, the abscissa axis represents the negative forming voltage VLb, and the ordinate axis represents the normal expectation value σ of a memory cell for which the forming is complete.

In the example in FIG. 14, the average of the negative forming voltage VLb is 2.1 V, and 1σ as a fluctuation index is 0.4 V approximately. The negative forming voltage VLb required for negative forming of all bits is estimated to be 3.4 V approximately (=2.1 V+3.3σ) based on FIG. 14 when the capacity of the memory cell array is, for example, 1 kilobit (i.e., 1024 bits).

Figure 15:
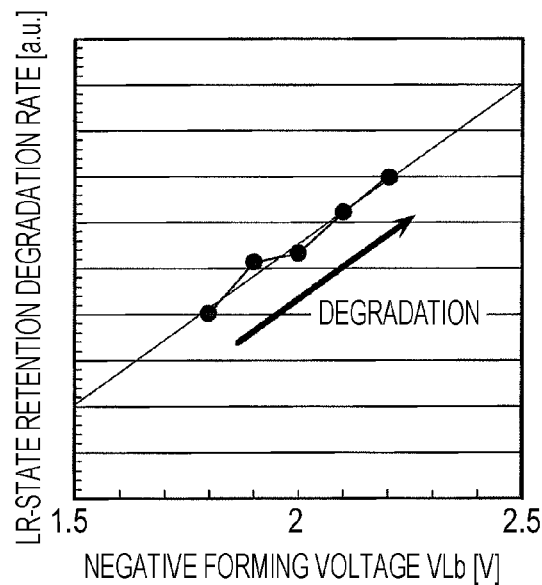
FIG. 15 is a characteristic diagram illustrating a relation between the degradation rate of retention in a low resistance state and the negative forming voltage in the variable-resistance element according to the study example.

FIG. 15 is a characteristic diagram illustrating a relation between the retention degradation rate in the low resistance state (LR state) and the negative forming voltage VLb for a set of memory cells of 1 kilobit included in the variable-resistance nonvolatile memory device according to the study example. The abscissa axis represents the negative forming voltage VLb, and the ordinate axis represents the degradation rate of retention after the set of memory cells were left at 150° C. for 50 hours. The degradation rate is given by (ILi-ILf)/Li, where ILi represents a cell current that flows through a memory cell in the low resistance state immediately after the negative pulse voltage (−VLb) is applied, and ILf represents a cell current that flows through the memory cell in the low resistance state after being left for a predetermined period. The cell current is a read current that flows through the 1T1R memory cell when a voltage of 0 V is applied to the lower electrode terminal 101, a voltage of 1.8 V is applied to the gate terminal 103, and a voltage of 0.4 V approximately is applied to the upper electrode terminal 102.

As illustrated in FIG. 15, a large negative forming voltage VLb leads to degradation of the retention characteristic in the low resistance state. This is because the large negative forming voltage VLb results in increases in negative forming current and the size of a formed filament, which then reduces the oxygen defect density in the filament. Accordingly, a hopping conduction path of electrons through oxygen defects becomes likely to be cut off, for example.

An increase in the capacity of the memory cell array leads to an increase in the negative forming voltage VLb required to complete the forming of all memory cells included in the memory cell array. With the negative forming voltage VLb being set to an extremely high value, however, the retention in the low resistance state degrades even when the voltage allows the negative forming to be performed on all memory cells. In addition, the variable-resistance nonvolatile memory device is required to have a structure of high voltage resistance in order to set the negative forming voltage VLb to a high value. In this case, it is difficult to reduce the area of a memory cell including a transistor of high voltage resistance, and thus to reduce cost, for example.

To solve this problem, the present disclosure provides a novel forming method capable of performing the forming of all memory cells in the memory cell array at a practical voltage and reducing degradation of the retention characteristic, and a variable-resistance nonvolatile memory device to which the forming is applied.

Those described in the present disclosure such as components, disposition and connection of the components, processing, processing order, numerical values, materials, voltage waveforms, and characteristics are merely examples. When not recited in an independent claim, any of the components described in the present disclosure is optional.

First Embodiment

Next follows a description of a first embodiment of the present disclosure.

[Forming Method for 1T1R Memory Cell]

Figure 1A:
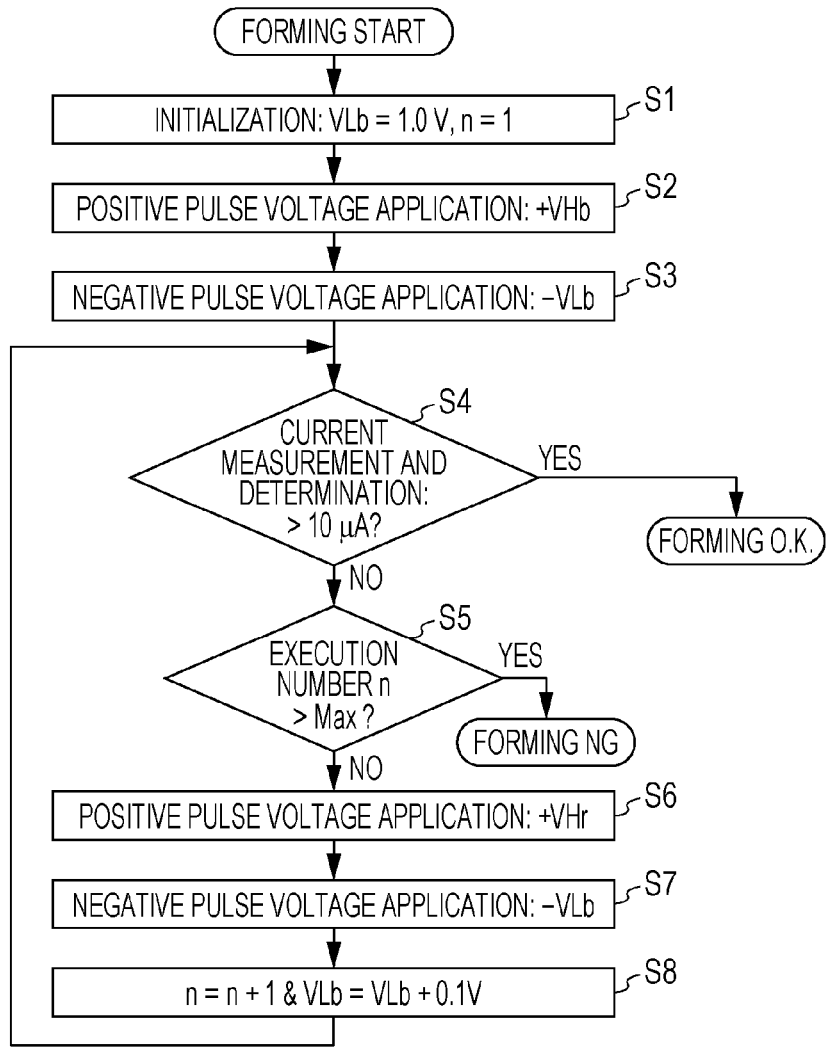
FIG. 1A is an exemplary flowchart of forming of a 1T1R memory cell according to a first embodiment of the present disclosure.

FIG. 1A is a flowchart of exemplary forming of a 1T1R memory cell according to the first embodiment. This flowchart includes eight steps S1 to S8.

The 1T1R memory cell has, for example, the configuration described with reference to FIG. 13. The 1T1R memory cell includes the variable-resistance element 100, which has, in an initial state, an extremely high resistance value of 1 MΩ or more until forming is applied after manufacturing. In the present disclosure, this initial state is also referred to as a first state.

In step S1, an initial setting is performed. For example, the negative forming voltage VLb to be applied to the variable-resistance element 100 is set to 1.0 V, and a value n of an execution counter is set to 1.

In step S2, the lower electrode terminal 101 is set to the ground voltage, and a positive pulse voltage is applied to the upper electrode terminal 102. This positive pulse voltage has a pulse width of, for example, 10 μs, and an amplitude (i.e., the positive forming voltage VHb) of, for example, 3.3 V. At this time, the gate terminal 103 has a voltage of, for example, 3.3 V. This positive pulse voltage in step S2 enables the negative forming voltage VLb for forming a filament in subsequent step S3 to be reduced. Step S2 is, however, optional.

In step S3, the upper electrode terminal 102 is set to the ground voltage, and a negative pulse voltage is applied once to the lower electrode terminal 101. This negative pulse voltage has a pulse width of, for example, 100 ns, and an amplitude (i.e., the negative forming voltage VLb) of, for example, 1.0 V. At this time, the gate terminal 103 has a voltage of, for example, 3.3 V. The negative pulse voltage applied in step S3 is an exemplary "first pulse voltage".

In step S4, the lower electrode terminal 101 is set to the ground voltage, and the upper electrode terminal 102 is connected with a voltage source for current measurement so as to measure current flowing from the upper electrode terminal 102 to the lower electrode terminal 101. The voltage source has a voltage of, for example, 0.4 V. At this time, the gate terminal 103 has a voltage of, for example, 3.3 V. If the current thus measured is larger than 10 μA (YES in step S4), the forming is determined to be complete, and the process ends. Such a resistance state that the forming is determined to be complete corresponds to a second state in which the high resistance state and the low resistance state are reversibly changeable depending on the polarity of an applied pulse voltage.

If the measured current is equal to or smaller than 10 μA (NO in step S4), the forming is determined to be incomplete, and the process proceeds to step S5.

In step S5, it is determined whether the value n of the execution counter exceeds a predetermined maximum execution number Max. If the value n of the execution counter exceeds the maximum execution number Max (YES in step S5), it is determined that the variable-resistance element 100 has a forming defect (N. G.), in other words, the memory cells are defect memory cells incapable of resistance changing. If the value n of the execution counter does not exceed the maximum execution number Max (NO in step S5), the process proceeds to step S6.

In step S6, the lower electrode terminal 101 is set to the ground voltage, and a positive pulse voltage is applied once to the upper electrode terminal 102. This positive pulse voltage has a pulse width of, for example, 100 ns, and an amplitude VHr of, for example, 3.3 V. At this time, the gate terminal 103 has a voltage of, for example, 3.3 V. The positive pulse voltage applied in step S6 is an exemplary "second pulse voltage".

In step S7, the upper electrode terminal 102 is set to the ground voltage, and a negative pulse voltage is applied once to the lower electrode terminal 101. This negative pulse voltage has a pulse width of, for example, 100 ns, and an amplitude (i.e., the negative forming voltage VLb) of, for example, 1.0 V. At this time, the gate terminal 103 has a voltage of 3.3 V. The negative pulse voltage applied in step S7 is an exemplary "third pulse voltage".

In step S8, the value n of the execution counter is incremented by one, and the negative forming voltage VLb is incremented by 0.1 V. Thereafter, the process returns back to step S4, and then the sequence including steps S4, S5, S6, S7, and S8 is executed again. This sequence is repeated until the forming is determined to be complete in step S4, while the negative forming voltage VLb is sequentially incremented according to the number of the executions.

The voltage applied to the gate terminal 103 in step S2 may be the same value (e.g., 3.3 V) as that of the voltage applied to the gate terminal 103 in step S3. In this case, a time loss for changing the gate voltage can be reduced. Alternatively, the voltage of the gate terminal 103 in step S2 may be the same value as that of a voltage in the case of reversibly changing the resistance value of the variable-resistance element after the forming, which is, for example, 2.4 V. The same arrangement applies to the gate voltage in step S4.

The voltage applied for current measurement in step S4 may be the same value (e.g., 0.4 V) as that of a voltage applied to read out the resistance value of the variable-resistance element 100 in the high resistance state or the low resistance state. In this case, influence of read disturb on the variable-resistance element 100 can be avoided.

The variable-resistance element 100 immediately after provided with the forming is likely to have a small difference between the resistance value in the high resistance state and the resistance value in the low resistance state. Thus, the determination in step S4 can achieve an improved accuracy by setting t The threshold of the determination to a value (e.g., 10 μA) may be set to be closer to the resistance value in the high resistance state than the intermediate value between the resistance value in the high resistance state and the resistance value in the low resistance state. This setting can improve the determination accuracy in step S4.

The amplitude VHr of the positive pulse voltage applied in step S6 may or may not be identical to the amplitude of the positive pulse voltage applied in step S2.

Figure 1B:
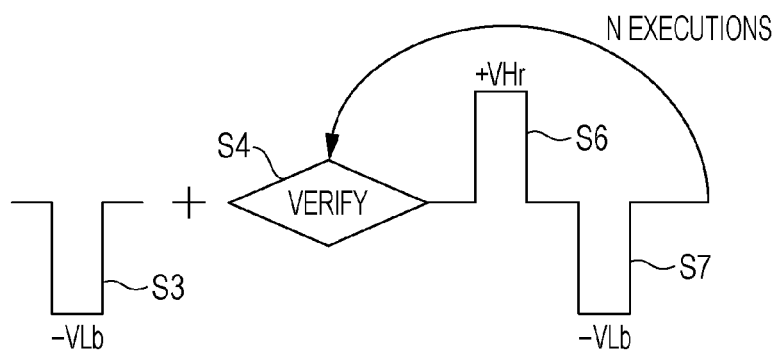
FIG. 1B is an exemplary conceptual diagram of forming according to the first embodiment.

FIG. 1B is a conceptual diagram of the first embodiment. As illustrated in FIG. 1B, the process according to the first embodiment includes steps S3, S4, S6, and S7 in the flowchart in FIG. 1A.

[Negative Forming Characteristic of 1T1R Memory Cell]

Figure 2:
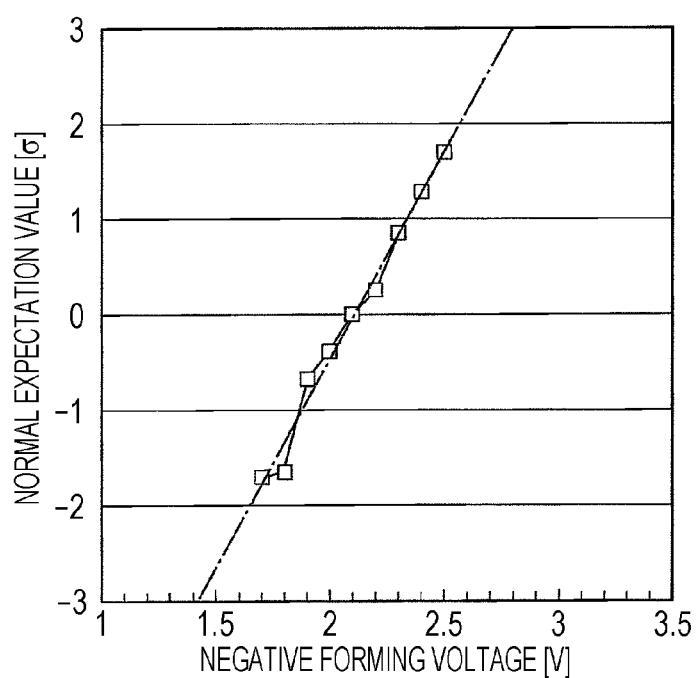
FIG. 2 is an exemplary distribution diagram of a normal expectation value of a negative forming voltage when forming of a variable-resistance element is performed in accordance with a process according to the first embodiment.

FIG. 2 is a characteristic diagram of a relation between the negative forming voltage VLb and the normal expectation value when the forming illustrated in FIG. 1A is performed on the set of 20 memory cells included in the variable-resistance nonvolatile memory device. Each memory cell has a structure illustrated in FIG. 13. The abscissa axis represents the negative forming voltage VLb when the forming of each memory cell is complete. The ordinate axis represents the normal expectation value σ of a memory cell for which the negative forming is complete.

FIG. 2 indicates that the average of the negative forming voltage VLb is 2.1 V and 1σ as a fluctuation index is 0.24 V approximately. The negative forming voltage VLb required for the negative forming of all bits is estimated to be 2.9 V approximately (=2.1 V+3.3σ) when the capacity of the memory cell array is, for example, 1 kilobit (i.e., 1024 bit).

As described above, the forming illustrated in FIG. 1A can provide a smaller fluctuation in the negative forming voltage VLb as compared to the forming according to the study example described with reference to FIG. 14. As a result, the maximum value of the negative forming voltage VLb required for the negative forming of all bits can be reduced. Accordingly, the degradation of the retention in the low resistance state can be reduced, and thus an improved reliability can be achieved. Since the negative forming voltage VLb is set low, for example, a high voltage resistance transistor may not be disposed in a memory cell and a peripheral circuit, thereby achieving a reduction in the area of the memory cell array.

[Variable-Resistance Nonvolatile Memory Device]

Figure 3:
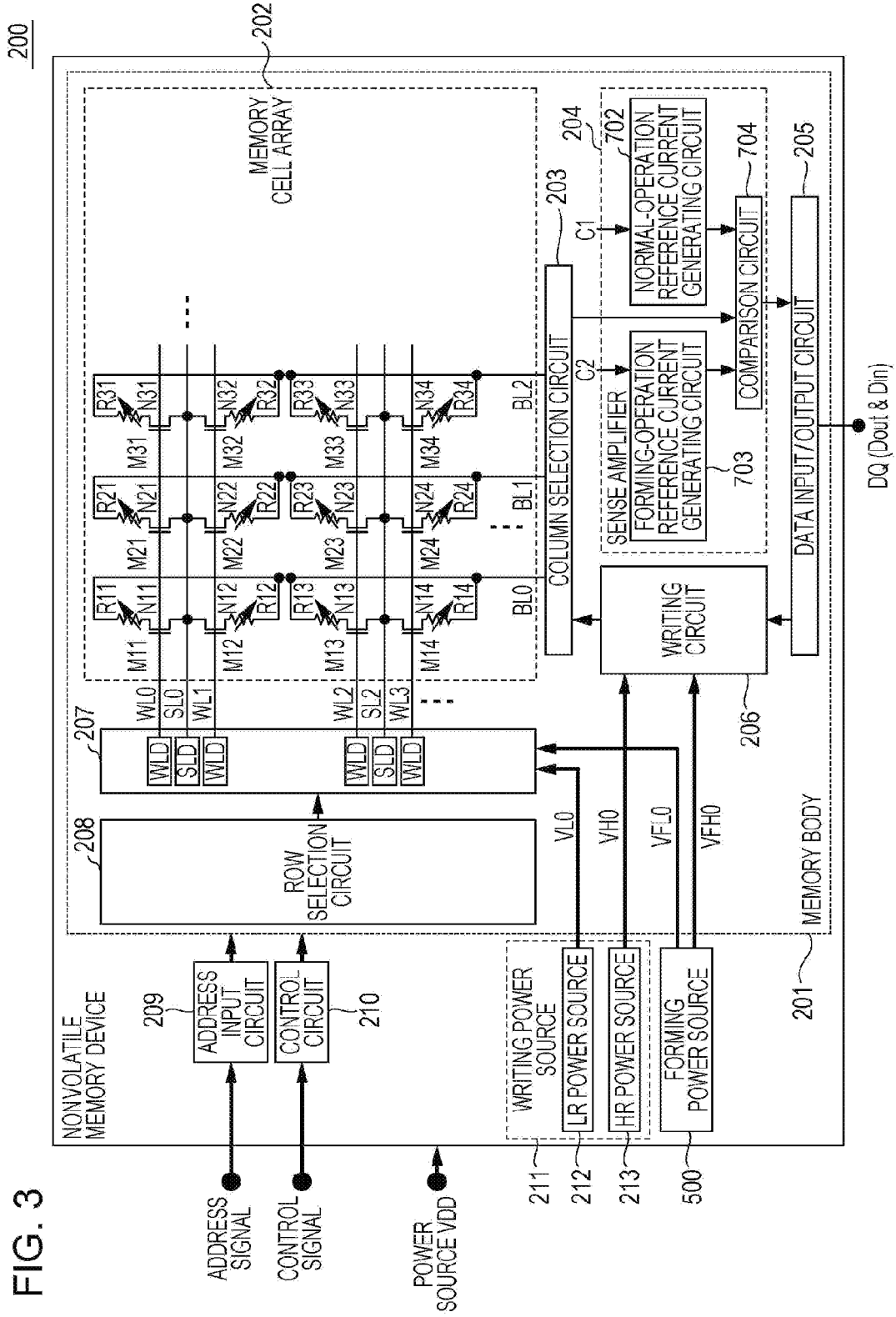
FIG. 3 is a circuit diagram of an exemplary configuration of a variable-resistance nonvolatile memory device according to the first embodiment.

FIG. 3 is a block diagram of an exemplary configuration of the variable-resistance nonvolatile memory device according to the first embodiment.

As illustrated in FIG. 3, this variable-resistance nonvolatile memory device 200 according to the present embodiment includes a memory body 201 on a semiconductor substrate. The memory body 201 includes a memory cell array 202, a row selection circuit 208, a row driver 207, a column selection circuit 203, a writing circuit 206, a sense amplifier 204, and a data input/output circuit 205. The memory cell array 202 includes a matrix of 1T1R memory cells. The row driver 207 includes a word line driver WLD and a source line driver SLD. The writing circuit 206 performs forming and data writing. The sense amplifier 204 detects the amount of current flowing through a selected bit line in data reading, and determines the high resistance state as "0" and the low resistance state as "1", for example. The data input/output circuit 205 performs inputting and outputting of input and output data through a terminal DQ.

The sense amplifier 204 includes a normal-operation reference current generating circuit 702, a forming-operation reference current generating circuit 703, and a comparison circuit 704. In the present disclosure, the "normal operation" means an operation performed on a memory cell on which the forming is complete. For example, the "normal operation" includes data reading from and data writing to a memory cell on which the forming is complete.

The variable-resistance nonvolatile memory device 200 further includes a high resistance (HR) power source 213, a low resistance (LR) power source 212, and a forming power source 500 as writing power sources 211.

The variable-resistance nonvolatile memory device 200 further includes an address input circuit 209 that receives an externally input address signal, and, a control circuit 210 that controls operation of the memory body 201 based on a control signal externally input.

The memory cell array 202 includes a plurality of word lines WLi (i=0, 1, 2, . . . ) and a plurality of source lines SLk (k=0, 2, . . . ) that are formed above the semiconductor substrate. The memory cell array 202 also includes a plurality of bit lines BLj (j=0, 1, 2, . . . ) arrayed in an intersecting manner with the word lines WLi and the source lines SLk. An NMOS transistor Nij and a variable-resistance element Rij are provided for each combination of a word line WLi and a bit line BLj. The NMOS transistor Nij, and the variable-resistance element Rij are connected in series to constitute a memory cell Mij.

The variable-resistance element Rij includes a first electrode, a second electrode, and a metal-oxide layer disposed between the first electrode and the second electrode. The metal-oxide layer contains oxygen-deficient metal oxide.

The oxygen-deficient metal oxide is a metal oxide having deficiency of oxygen relative to that in a stoichiometric composition. An "oxygen deficiency" means the ratio of the deficient amount of oxygen contained in a target metal oxide relative to the amount of oxygen contained in a stoichiometric metal oxide which contains the same metal as that in the target metal oxide. If there are plural kinds of stoichiometric metal oxides each of which consists of the same element as the target metal oxide, the oxygen deficiency of the metal oxide can be defined on the basis of one stoichiometric metal oxide having the highest resistance value. A stoichiometric metal oxide is more stable and has a higher resistance value than a metal oxide having any other composition.

For example, when the metal is tantalum (Ta), a stoichiometric tantalum oxide according to the above-described definition is $Ta_2O_5$ and thus can be written as $TaO_{2.5}$. $TaO_{2.5}$ has an oxygen deficiency of 0%, and $TaO_{1.5}$ has an oxygen deficiency of $(2.5-1.5)/2.5=40\%$. An oxygen-excess metal oxide has a negative oxygen deficiency. In the present specification, unless otherwise stated, the oxygen deficiency can be positive, 0, or negative.

An oxide having a small oxygen deficiency, which is characteristically closer to an oxide having a stoichiometric composition, has a high resistance value. An oxide having a large oxygen deficiency, which is characteristically closer to a metal contained in the oxide, has a low resistance value.

The metal-oxide layer may include a plurality of layers having different oxygen deficiencies and/or oxygen contents. For example, the metal-oxide layer includes a first metal-oxide layer and a second metal-oxide layer.

The "oxygen content" is the ratio of the number of oxygen atoms relative to the total number of atoms contained in the target metal oxide. For example, $Ta_2O_5$ has an oxygen content (O/(Ta+O)) of 71.4 atm %. Oxygen-deficient tantalum oxide has an oxygen content equal to or larger than 0 and smaller than 71.4 atm %. For example, when the metal contained in the first metal-oxide layer is the same as the metal contained in the second metal-oxide layer, the oxygen content corresponds to the oxygen deficiency. In other words, when the second metal-oxide layer has an oxygen content larger than that of the first metal-oxide layer, the second metal-oxide layer has an oxygen deficiency smaller than that of the first metal-oxide layer.

For example, characteristics of a variable-resistance element including a variable-resistance layer made of oxygen-deficient tantalum oxide ($TaO_{1.54}$) are disclosed in International Publication No. WO 2009/050833, International Publication No. WO 2010/021134, and International Publication No. WO 2009/141857. In the present disclosure, the contents of these disclosures are incorporated by reference.

The memory cell Mij is, for example, the 1T1R memory cell illustrated in FIG. 13. This memory cell, after completion of the forming, can reversibly change between the low resistance state and the high resistance state depending on application of pulse voltages having different polarities. For example, when a positive pulse voltage is applied to the upper electrode 100c with respect to the lower electrode 100a, an oxidation reaction occurs at the interface between the upper electrode 100c and the second tantalum oxide layer 100b-2, and the variable-resistance element 100 transitions from the low resistance state to the high resistance state. In contrast, when a positive pulse voltage is applied to the lower electrode 100a with respect to the upper electrode 100c, a reduction reaction occurs at the interface between the upper electrode 100c and the second tantalum oxide layer 100b-2, and the variable-resistance element 100 transitions from the high resistance state to the low resistance state.

In the example illustrated in FIG. 13, the switch element is an NMOS transistor, but may be a PMOS transistor or a bidirectional diode.

In the forming process, the control circuit 210 outputs, to the forming power source 500 and the writing circuit 206, a signal that instructs application of a forming voltage. In a data writing cycle, the control circuit 210 outputs, to the writing circuit 206, a signal that instructs application of a writing voltage in accordance with input data Din input to the data input/output circuit 205. In a data reading cycle, the control circuit 210 outputs, to the sense amplifier 204, a signal that instructs a reading operation.

The row selection circuit 208 selects one from the word lines WLi (i=0, 1, 2, . . . ) in accordance with a column address signal output from the address input circuit 209. The row selection circuit 208 then applies a predetermined voltage to the word line thus selected through a word line driver circuit WLD of the row driver 207.

In addition, the row selection circuit 208 selects one from the source lines SLk (k=0, 2, . . . ) in accordance with a column address signal output from the address input circuit 209. The row selection circuit 208 then applies a predetermined voltage to the source line thus selected through a source line driver circuit SLD of the row driver 207.

In a normal operation mode, the writing circuit 206 generates a pulse voltage having a pulse width of, for example, 100 ns, when received the signal for writing from the control circuit 210. In a forming mode, the writing circuit 206 generates a forming pulse having a constant pulse width of, for example, 100 ns. The writing pulse and forming pulse thus generated each are applied to a bit line selected by the column selection circuit 203. The column selection circuit 203 selects one from the bit lines in accordance with a column address signal output from the address input circuit 209.

The writing power source 211 includes the LR power source 212 for causing the memory cell to fall into a low resistance state and the HR power source 213 for causing the memory cell to fall into a high resistance state. An output VL0 of the LR power source 212 is input to the row driver 207, and an output VH0 of the HR power source 213 is input to the writing circuit 206.

An output VFL0 of the forming power source 500 is input to the row driver 207, and an output VFH0 thereof is input to the writing circuit 206.

The normal-operation reference current generating circuit 702 is activated by a reading enable signal C1 in data reading, and thereby outputs a reading reference current to the comparison circuit 704. The forming-operation reference current generating circuit 703 is activated by a forming enable signal C2 in a forming operation, and thereby outputs a forming reference current to the comparison circuit 704. The comparison circuit 704 executes a determination based on a comparison between a reference current, which is one of the reading reference current and the forming reference current, and a current flowing a memory cell which is connected with the bit line selected by the column selection circuit 203, and thus outputs a result of the determination to the data input/output circuit 205.

At least some of functional blocks illustrated in FIG. 3 may be executed by a semiconductor apparatus, a semiconductor integrated circuit (IC), an LSI (large scale integration), or an electronic circuit as a combination thereof. The LSI or the IC may be integrated on a single chip, or may be a combination of a plurality of chips. For example, the functional blocks may be integrated on a single chip. The LSI or the IC can be referred to as, for example, a system LSI, a VLSI (very large scale integration), or an ULSI (ultra large scale integration) depending on the degree of integration.

In FIG. 3, a circuit group including the sense amplifier 204, the writing circuit 206, and the control circuit 210 is an exemplary "circuitry" in the present disclosure. The writing circuit 206 is an exemplary "voltage application circuit" in the present disclosure. The comparison circuit 704 is an exemplary "determination circuit" in the present disclosure. The forming-operation reference current generating circuit 703 is an exemplary "reference current generation circuit" in the present disclosure.

A forming method according to the present disclosure may not be executed by the variable-resistance nonvolatile memory device 200 illustrated in FIG. 3. For example, the forming method according to the present disclosure may be executed by a combination of a variable-resistance nonvolatile memory device not including a functional block used for forming, and another device capable of executing the forming of a plurality of variable-resistance nonvolatile memory devices.

[Sense Amplifier]

Figure 4:
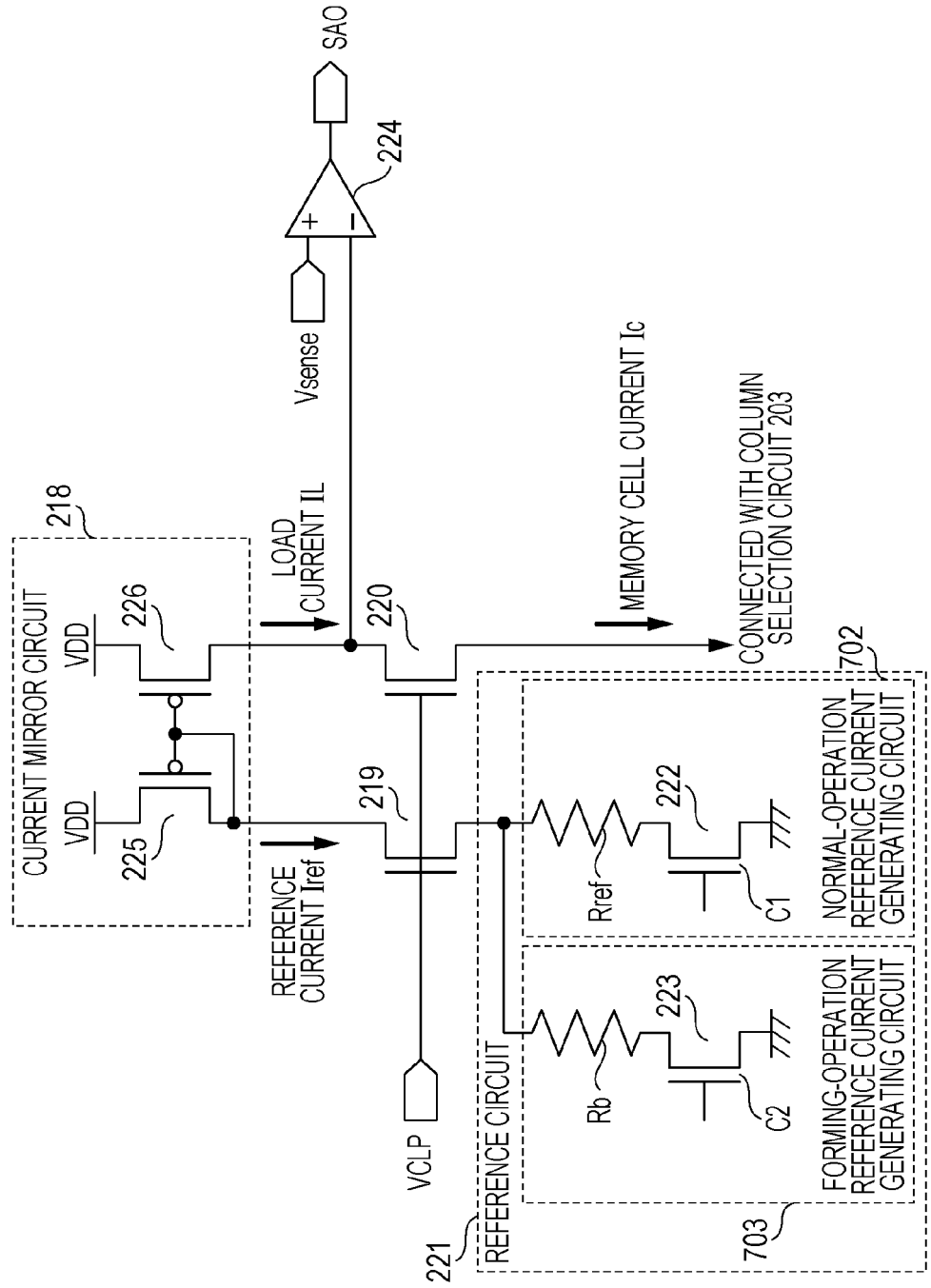
FIG. 4 is a circuit diagram of an exemplary configuration of a sense amplifier according to the first embodiment.

FIG. 4 is a circuit diagram illustrating an exemplary detailed configuration of the sense amplifier 204 in FIG. 3.

The sense amplifier 204 includes a current mirror circuit 218 having a mirror ratio of 1:1, clamp transistors 219 and 220 having identical dimensions, a reference circuit 221, and a differential amplifier 224. The reference circuit 221 includes the normal-operation reference current generating circuit 702 and the forming-operation reference current generating circuit 703.

The normal-operation reference current generating circuit 702 includes a selection transistor 222 and a reference resistance Rref that are connected in series with each other. One end of the normal-operation reference current generating circuit 702 is connected with the ground potential, and the other end of that is connected with the source terminal of the clamp transistor 219. The reference resistance Rref is set to the resistance value corresponding to a current value substantially intermediate between a current flowing through a memory cell in the high resistance state in data reading and a current flowing through a memory cell in the low resistance state, for example. The reading enable signal C1 is input to the gate terminal of the selection transistor 222, and in response to this reading enable signal C1, the selection transistor 222 can switch between a conductive state and a non-conductive state.

The forming-operation reference current generating circuit 703 includes a selection transistor 223 and a reference resistance Rb that are connected in series with each other. One end of the forming-operation reference current generating circuit 703 is connected with the ground potential, and the other end of that is connected with the source terminal of the clamp transistor 219. The reference resistance Rb is used in a forming operation, and is set to a resistance value lower than the resistance value in the high resistance state to be written in a normal operation. The forming enable signal C2 is input to the gate terminal of the selection transistor 223, and in response to the forming enable signal C2, the selection transistor 223 can switch between a conductive state and a non-conductive state.

A clamp voltage VCLP is input to the gate terminals of the clamp transistors 219 and 220. The source terminal of the clamp transistor 220 is connected with a memory cell through the column selection circuit 203 and a bit line. The drain terminals of the clamp transistors 219 and 220 are connected with the respective drain terminals of transistors 225 and 226 included in the current mirror circuit 218. The differential amplifier 224 inverts the voltage form the drain terminal of the clamp transistor 220, amplifies the difference between the inverted terminal's voltage of the differential amplifier 224 and a reference voltage Vsense, and then outputs the amplified voltage as a sense amplifier output SAO to the data input/output circuit 205.

Figure 5:
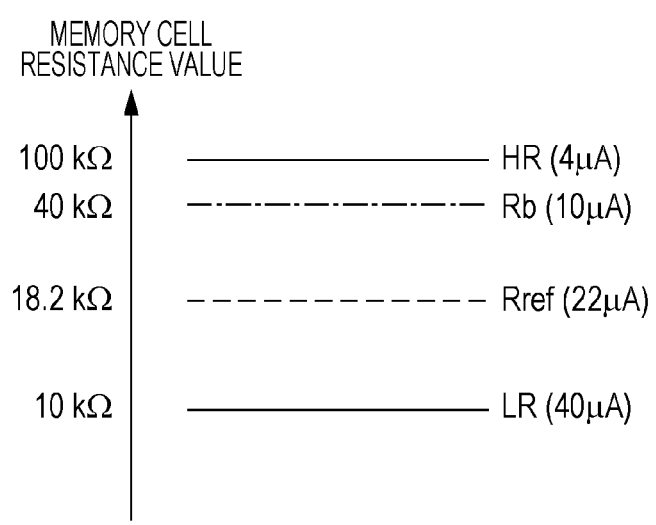
FIG. 5 is an exemplary diagram of determination levels of the sense amplifier according to the first embodiment.

FIG. 5 is an exemplary diagram of determination levels of the sense amplifier 204. As illustrated in FIG. 5, the sense amplifier 204 has two determination levels of the data-reading reference resistance Rref (e.g., 18.2 kΩ) and the forming reference resistance Rb (e.g., 40 kΩ) between a resistance value HR in the high resistance state (e.g., 100 kΩ) and a resistance value LR in the low resistance state (e.g., 10 kΩ). The forming reference resistance Rb may be set to a value slightly smaller than the resistance value HR in the high resistance state in order to determine whether the forming of the variable-resistance element is complete. The data reading reference resistance Rref is set to a value smaller than the resistance value HR in the high resistance state and larger than the resistance value LR in the low resistance state in order to determine whether the variable-resistance element is in the high resistance state or the low resistance state.

[Operation of Sense Amplifier]

Next follows a description of an operation of the sense amplifier 204 illustrated in FIG. 4 in forming.

The sense amplifier 204 is connected with a selected memory cell through the column selection circuit 203 and a bit line after a positive pulse voltage and a negative pulse voltage are applied to the variable-resistance element. This prevents application of a voltage larger than voltage values lower than the clamp voltage VCLP by threshold voltages of the clamp transistors 219 and 220 to the memory cell. In the reference circuit 221, the selection transistor 223 becomes a conductive state in response to the forming enable signal C2, and the forming reference resistance Rb is selected. Simultaneously, the selection transistor 222 becomes a non-conductive state in response to the reading enable signal C1. Accordingly, a reference current Iref flows.

The reference current Iref is mirrored by the current mirror circuit 218, and a load current IL flows from the current mirror circuit 218. A potential of the drain terminal of the clamp transistor 220 is determined according to the magnitude relation between the load current IL and a memory cell current Ic. The differential amplifier 224 inverts the voltage form the drain terminal of the clamp transistor 220, amplifies the difference between the inverted terminal's voltage of the differential amplifier 224 and the reference voltage Vsense, and then outputs the amplified voltage as the sense amplifier output SAO.

The following describes an exemplary case in which the clamp voltage VCLP is 0.9 V, the threshold voltages of the clamp transistors 219 and 220 are 0.5 V, the forming reference resistance Rb is 40 kΩ, the data reading reference resistance Rref is 18.2 kΩ, and the reference voltage Vsense is 1.1 V. In this case, the reference current Iref is 10 μA (=(0.9−0.5)/40 kΩ), and the load current IL is 10 μA approximately.

When a selected memory cell is in the initial state and has a resistance value of 20 MΩ, the memory cell current Ic is 0.02 μA (=0.4 V/20 MΩ), and the load current IL is larger than the memory cell current Ic. Accordingly, the voltage of the drain terminal of the clamp transistor 220 becomes higher than the reference voltage Vsense after a predetermined time, and thereby the sense amplifier 204 outputs an "L level" as the sense amplifier output SAO. In other words, when the forming of the selected memory cell is incomplete, the sense amplifier output is the "L level".

When the selected memory cell is provided with the forming and has a resistance value of 12 kΩ, the memory cell current Ic is 33.3 μA approximately (=0.4 V/12 kΩ, and the load current IL is smaller than the memory cell current Ic. Accordingly, the voltage of the drain terminal of the clamp transistor 220 becomes lower than the reference voltage Vsense after a predetermined time, and thereby the sense amplifier 204 outputs an "H level" as the sense amplifier output SAO. In other words, when the forming of the selected memory cell is complete, the sense amplifier output is the "H level".

In data reading operation, the selection transistor 222 becomes a conductive state in response to the reading enable signal C1, and the data reading reference resistance Rref (e.g., 18.2 kΩ) is selected. The selection transistor 223 becomes a non-conductive state in response to the forming enable signal C2. Accordingly, the sense amplifier 204 executes a determination based on the reference current Iref, which are different from those in forming operation, and the load current IL, and then outputs the sense amplifier output SAO.

[Applied Voltage in Each Operation]

FIG. 6 illustrates a table of voltages set to a word line WL, a source line SL, and a bit line BL in operation modes of application of a positive pulse voltage, application of a negative pulse voltage, and reading in forming, and writing of "0", writing of "1", and reading in a normal operation. In the table, the writing of "0" represents a transition of the variable-resistance element from the low resistance state to the high resistance state, and the writing of "1" represents a transition of the variable-resistance element from the high resistance state to the low resistance state.

In the example illustrated in FIG. 6, the amplitudes VHb and VHr of a positive pulse voltage in forming correspond to the amplitude of a voltage applied to the bit line BL with respect to the source line SL. The amplitude VLb of a negative pulse voltage in forming corresponds to the amplitude of a voltage applied to the source line SL with respect to the bit line BL. The amplitude VH of a positive pulse voltage in the writing of "0" corresponds to the amplitude of a voltage applied to the bit line BL with respect to the source line SL. The amplitude VL of a negative pulse voltage in the writing of "1" corresponds to the amplitude of a voltage applied to the source line SL with respect to the bit line BL.

Second Embodiment

In a second embodiment of the present disclosure, forming is performed on the memory cells included in the variable-resistance nonvolatile memory device. For example, the variable-resistance nonvolatile memory device 200 described in the first embodiment is applicable as the variable-resistance nonvolatile memory device.

Figure 7:
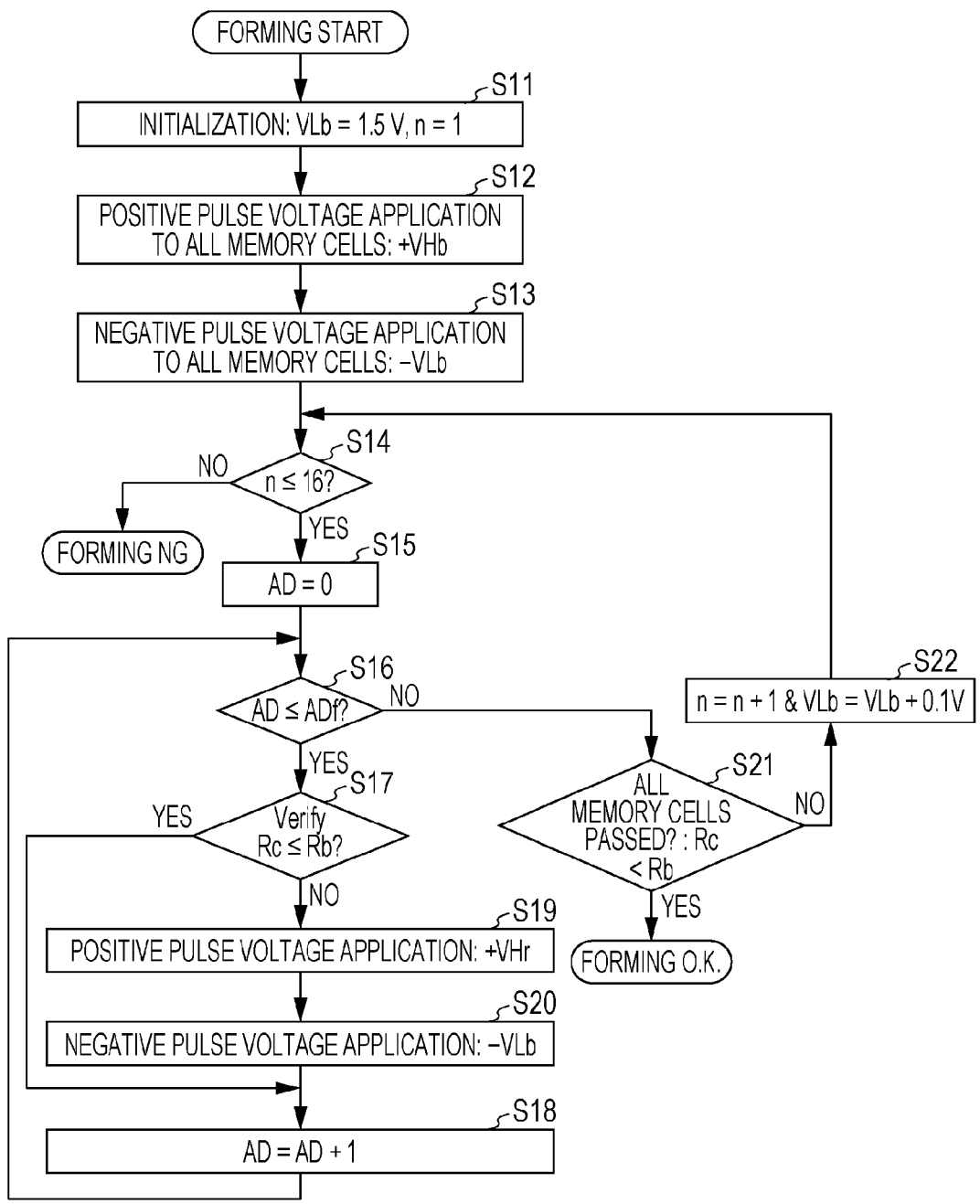
FIG. 7 is an exemplary flowchart of forming in the variable-resistance nonvolatile memory device according to a second embodiment of the present disclosure.

FIG. 7 illustrates an exemplary forming operation of the variable-resistance nonvolatile memory device 200.

In step S11, the negative forming voltage VLb and the value of the execution counter are initialized. In this example, the negative forming voltage VLb is set to 1.5 V, and the value n of the execution counter initialized to 1.

In step S12, a positive pulse voltage is applied to all memory cells (e.g., 1 kilobit) of the memory cell array 202. The positive pulse voltage has a pulse width of, for example, 10 μs, and an amplitude (i.e., the positive forming voltage VHb) of, for example, 3.3 V. The positive pulse voltage in step S12 enables the negative forming voltage VLb in subsequent step S13 to be reduced. Step S12 is, however, optional.

In step S13, a negative pulse voltage is applied to all memory cells of the memory cell array 202. The negative pulse voltage has a pulse width of, for example, 100 ns, and an amplitude (i.e., the negative forming voltage VLb) of, for example, 1.5 V.

In step S14, it is determined whether the value n of the execution counter is equal to or smaller than 16. If the value n of the execution counter is larger than 16 (NO in step S14), it is determined that a forming defect exists, and the forming operation ends. If the value n of the execution counter is equal to or smaller than 16 (YES in step S14), a conditioned pulse application (steps S15 to S20) is executed.

In step S15, an address AD of a memory cell is initialized (AD=0).

In step S16, it is determined whether the address AD is equal to or less than a final address ADf of the memory cell array 202, for example. If the address AD is equal to or less than the final address ADf (YES in step S16), the process proceeds to step S17.

In step S17, a memory cell specified by the address AD is selected, it is verified whether a resistance value Rc of the memory cell thus selected is smaller than the reference resistance Rb.

If the resistance value Rc of the selected memory cell is smaller than the forming reference resistance Rb (YES in step S17), it is determined that the forming is complete, and the process proceeds to step S18. In step S18, the address AD is incremented to select a memory cell at the next address AD.

If the resistance value Rc of the selected memory cell is equal to or larger than the forming reference resistance Rb (NO in step S17), it is determined that the forming is incomplete, and the process proceeds to step S19. In step S19, a positive pulse voltage is applied to the selected memory cell. This positive pulse voltage has a pulse width of, for example, 100 ns, and the amplitude VHr of, for example, 3.3 V.

In step S20, a negative pulse voltage is applied to the selected memory cell. This negative pulse voltage has a pulse width of, for example, 100 ns, and an amplitude (i.e., the negative forming voltage VLb) of, for example, 1.5 V.

After step S20, in step S18, the address AD of the memory cell is incremented to newly select a memory cell at the next address AD.

Thereafter, the sequence including steps S16 to S20 is repeated until the address AD of a memory cell becomes larger than the final address ADf.

If it is determined in step S16 that the address AD is larger than the final address ADf (NO in step S16), the process proceeds to step S21. In step S21, it is determined by an external device such as a memory tester whether the resistance value Rc of each memory cell of the memory cell array 202 is smaller than the forming reference resistance Rb. If the resistance value Rc of at least one memory cell is smaller than the reference resistance Rb (NO in step S21), in step S22, the value n of the execution counter is incremented by +1, and the negative forming voltage VLb is incremented by +0.1 V. Accordingly, the value n of the execution counter is set to 2, and the negative forming voltage VLb is set to 1.6 V.

Thereafter, the process returns to step S14, and it is determined whether the value n of the execution counter is equal to or smaller than 16. The sequence including steps S14 to S22 is repeated until the value n of the execution counter becomes larger than 16 (NO in step S14), or until the forming of all memory cells is complete (YES in step S21).

With the above-described forming processing, the positive pulse voltage and the negative pulse voltage are applied only to at least one memory cell that requires the forming, thereby achieving fast forming of the memory cell array. Since the increment of the negative forming voltage VLb is performed after a sequence including steps S17, S19, and S20 is performed once for each memory cell, the number of change of the voltage VLb can be reduced, and thus a forming time can be significantly shortened.

The negative pulse voltage in step S13 is an exemplary "first pulse voltage" in the present disclosure. The positive pulse voltage in step S19 is an exemplary "second pulse voltage" in the present disclosure. The negative pulse voltage in step S20 is an exemplary "third pulse voltage" in the present disclosure. The processing in step S17 corresponds to determining whether a selected variable-resistance nonvolatile memory element is in the second state. The processing in steps S19 and S20 corresponds to continuously applying the second pulse voltage followed by the third pulse voltage to the selected variable-resistance nonvolatile memory element when the selected variable-resistance nonvolatile memory element is not in the second state.

The processing in step S21 corresponds to determining whether a plurality of variable-resistance nonvolatile memory elements are all in the second state.

The pulse width of the second pulse voltage may be fixed independently from the number of repetitions. The pulse width of the second pulse voltage may be different from that of the third pulse voltage.

[Applied Voltage in Each Operation]

Figure 8:
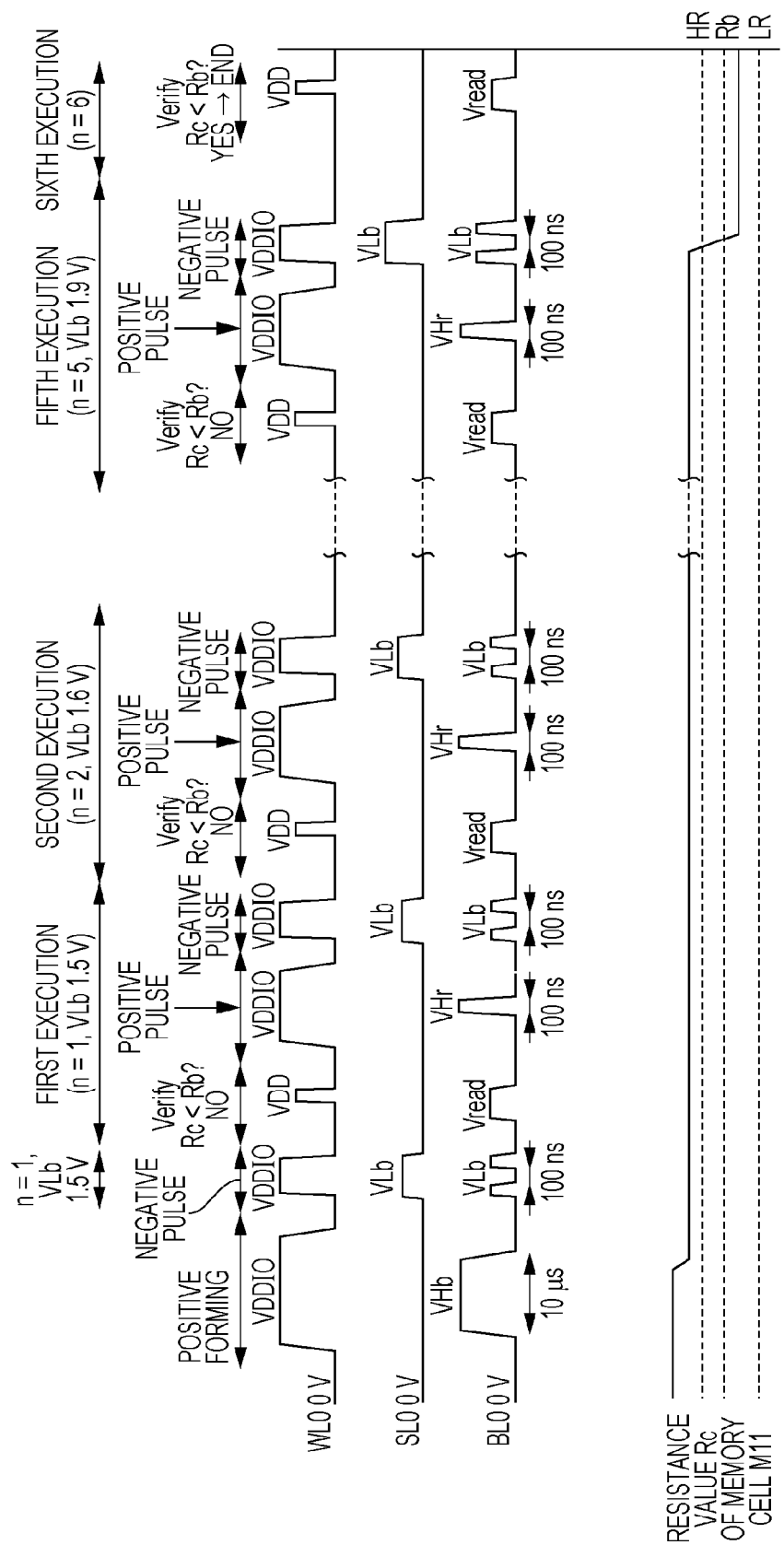
FIG. 8 is an exemplary timing chart of a forming operation in the variable-resistance nonvolatile memory device according to the second embodiment.

FIG. 8 is a timing chart illustrating an exemplary forming operation of the variable-resistance nonvolatile memory device 200 illustrated in the flowchart in FIG. 7. FIG. 8 illustrates pulse voltages applied to a memory cell M11 at the address AD of 0 in the memory cell array 202.

In FIG. 8, at start of forming, voltages of a word line WL0, a bit line BL0, and a source line SL0 that are connected with the memory cell M11 are all 0 V. The memory cell M11 is in an initial state.

In step S11 illustrated in FIG. 7, the negative forming voltage VLb is set to 1.5 V, and the value n of the execution counter is initialized to 1.

In step S12, a positive pulse voltage having a pulse width of 10 μs and an amplitude (i.e., the positive forming voltage VHb) of 3.3 V is applied. In step S13, a negative pulse voltage having a pulse width of 100 ns and an amplitude (i.e., the negative forming voltage VLb) of 1.5 V is applied.

In step S14, it is determined whether the value n of the execution counter is equal to or smaller than 16. The value n of the execution counter is 1 in the initial state, and thus a determination of "Yes" is made in step S14. In step S15, the address AD of the memory cell is initialized (AD=0), and the process proceeds to step S17.

In step S17, it is verified whether the resistance value Rc of the memory cell is smaller than the forming reference resistance Rb. Specifically, the voltage of the bit line BL0 is set to a read voltage Vread (e.g., 0.4 V), and thereafter, the voltage of the word line WL0 is set to VDD (e.g., 1.8 V) to turn on an NMOS transistor N11 of the memory cell M11. Next, a current value flowing the memory cell M11 is detected by the sense amplifier 204 to determine whether the resistance value Rc of the memory cell M11 is smaller than the forming reference resistance Rb. In the example illustrated in FIG. 8, since the resistance value Rc is equal to or larger than the forming reference resistance Rb at the first verification, the L level is output as the sense amplifier output SAO, and "0" is output to the terminal DQ. In this manner, the incompletion of forming is notified to an external device (e.g., a memory tester). Thereafter, the voltages of the word line WL0 and the bit line BL0 are set to 0 V.

In step S19, a positive pulse voltage having a pulse width of 100 ns and the amplitude VHr of 3.3 V is applied to the memory cell M11. Specifically, the word line WL0 is set to a voltage VDDIO (e.g., 3.3 V) to turn on the NMOS transistor N11 of the memory cell M11. Next, the voltage of the bit line BL0 is changed from 0 V to VHr (e.g., 3.3 V), and then changed from VHr to 0 V after a predetermined duration (e.g., 100 ns). Thereafter, the voltage of the word line WL0 is set to 0 V, which completes the application of the positive pulse voltage.

In step S20, a negative pulse voltage having a pulse width of 100 ns and the amplitude VLb of 1.5 V is applied to the memory cell M11. Specifically, first, the bit line BL0 and the source line SL0 are both set to the voltage VLb (1.5 V). Next, the voltage of the word line WL0 is set to the voltage VDDIO (e.g., 3.3 V). At this stage, the NMOS transistor N11 of the memory cell M11 is still off. Next, the voltage of the bit line BL0 is changed from VLb to 0 V, and then changed from 0 V to VLb after a predetermined duration (e.g., 100 ns). Accordingly, a negative pulse voltage (−1.5 V) is applied to the memory cell M11. Thereafter, the voltage of the word line WL0 is set to 0 V, which completes the application of the negative pulse voltage.

After the sequence including steps S17, S19, and S20 is executed for all memory cells, the process proceeds to step S22. In step S22, the value n of the execution counter is incremented by +1 and set to 2. In addition, the negative forming voltage VLb is incremented by +0.1 V and set to 1.6 V.

In the example in FIG. 8, at the fifth repetition of the sequence including steps S14 to S22, the forming of the memory cell M11 is successful and the resistance value Rc of the memory cell M11 becomes less than the reference resistance Rb. At this time, a filament (i.e., a conduction path) is formed in the memory cell M11.

The sixth verification (step S17) detects that the resistance value Rc of the memory cell M11 is less than the reference resistance Rb, and accordingly, the "H level" is output as the sense amplifier output SAO, and "1" is output to the terminal DQ. In this manner, the completion of the forming of the memory cell M11 is notified to an external device (e.g., a memory tester). This completes the forming of the memory cell M11.

The voltage of the word line WL0, the low resistance pulse voltage, and the high resistance pulse voltage may or may not be identical.

The second embodiment can provide the same effects as those of the first embodiment.

Third Embodiment

In a third embodiment of the present disclosure, the negative forming voltage VLb is not incremented but fixed. This embodiment is described below.

Figure 9:
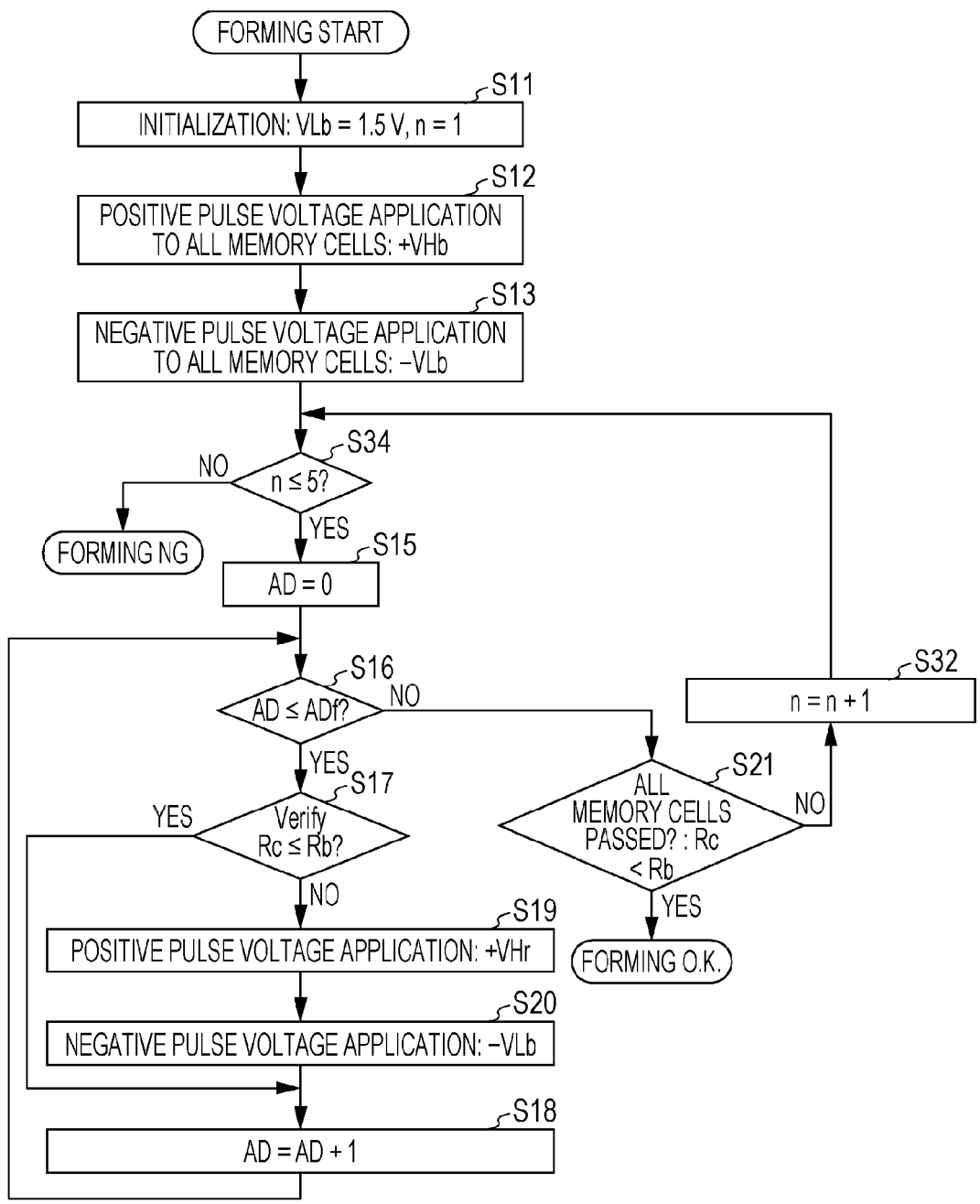
FIG. 9 is an exemplary flowchart of forming in the variable-resistance nonvolatile memory device according to a third embodiment of the present disclosure.

FIG. 9 is a flowchart of an exemplary forming according to the third embodiment. In FIG. 9, any component same as that in FIG. 7 is denoted by the same reference numeral, and a description thereof is omitted. In the third embodiment, all memory cells of the memory cell array (e.g., 1 kilobit) are previously set to a maximum voltage (e.g., 2.9 V) estimated to allow for the negative forming. This makes it possible to omit the increment of the negative forming voltage VLb. This set voltage is estimated based on, for example, the distribution diagram of the normal expectation value of the negative forming voltage VLb illustrated in FIG. 2.

The flowchart in FIG. 9 differs from the flowchart in FIG. 7 in steps S32 and S34. The other steps are identical, and thus these different steps are described below.

In step S32, the increment of the negative forming voltage VLb is not performed, while the value n of the execution counter is incremented by +1. The maximum value of the value n of the execution counter in step S34 is set to 5. The order of the other steps, and the pulse width and amplitude of a pulse voltage applied at each step are identical to those in the flowchart in FIG. 7.

When forming is performed in accordance with the flowchart in FIG. 9, the negative forming voltage VLb is fixed to 2.9 V in the timing chart illustrated in FIG. 8.

The maximum value of the value n of the execution counter may not to be 5, and may be, for example, 1.

The third embodiment provides the same effects as those in the second embodiment. In the third embodiment, the change of the negative forming voltage VLb is not required, and the number of executions of the conditioned pulse application (steps S15 to S20) is reduced. As a result, the process of forming is simplified to achieve fast forming, thereby shortening a time required for the forming.

Fourth Embodiment

A fourth embodiment of the present disclosure is an IC card on which the variable-resistance nonvolatile memory device described in the first, second, or third embodiment is mounted.

Figure 16:
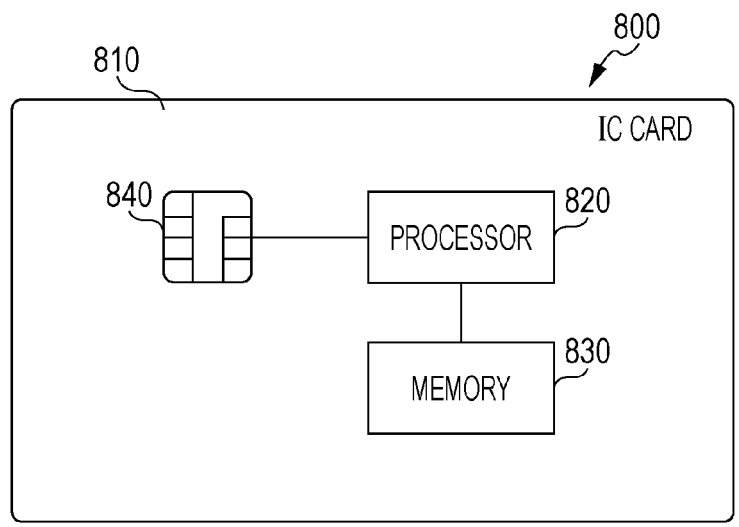
FIG. 16 is an exemplary conceptual diagram of an exemplary IC card.
Figure 17:
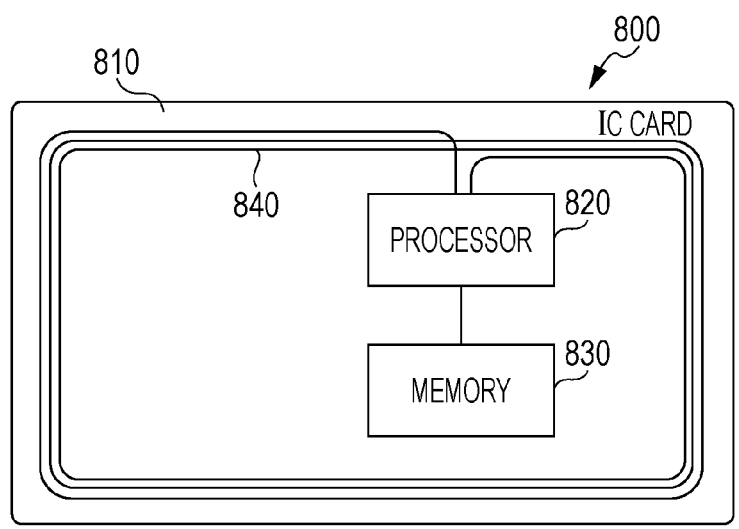
FIG. 17 is an exemplary conceptual diagram of an exemplary IC card.

FIGS. 16 and 17 are each a conceptual diagram of an exemplary IC card on which the variable-resistance non-volatile memory device according to the present disclosure is mounted.

As illustrated in FIGS. 16 and 17, this IC card 800 includes a processor 820, a memory 830, and an interface 840 that are mounted on, for example, a resin plate 810. The memory 830 includes, for example, the variable-resistance nonvolatile memory device 200 described above. The interface 840 may be an electric contact externally exposed from the resin plate 810 as illustrated in FIG. 16. The interface 840 may be an antenna sealed inside the resin plate 810 as illustrated in FIG. 17. In the IC card 800, electrical power supplied through the interface 840 in a wired or wireless manner enables the processor 820 to execute a previously held program by using the memory 830.

The above-described configuration provides an IC card having an improved reliability with a variable-resistance nonvolatile memory device mounted thereon, which has an improved retention characteristic.

Other Embodiments

The forming method and the variable-resistance nonvolatile memory device according to the present disclosure are described above based on a plurality of embodiments. However, the present disclosure is not limited to these embodiments. Various modifications thought of by the skilled person in the art without departing from the scope of the present disclosure may be provided. The present disclosure may include any configuration as an optional combination of components in the embodiments.

A forming method according to an embodiment of the present disclosure changes a variable-resistance nonvolatile memory element from a first state after manufacturing to a second state in which the variable-resistance nonvolatile memory element is reversibly changeable between a high resistance state and a low resistance state depending on a polarity of an applied pulse voltage, the variable-resistance nonvolatile memory element including a first electrode, a second electrode, and a metal-oxide layer sandwiched between the first electrode and the second electrode. The variable-resistance nonvolatile memory element has, in the first state, a resistance larger than a resistance in the high resistance state, and has, in the second state, a resistance that becomes low when a fourth pulse voltage having a positive polarity at the first electrode with respect to the second electrode is applied, and becomes high when a fifth pulse voltage having a positive polarity at the second electrode with respect to the first electrode is applied. The forming method applies a first pulse voltage having a positive polarity at the first electrode with respect to the second electrode to the variable-resistance nonvolatile memory element in the first state after manufacturing, and performs at least one conditioned pulse application after applying the first pulse voltage. The conditioned pulse application determines whether the variable-resistance nonvolatile memory element is in the second state, and when the variable-resistance nonvolatile memory element is determined not to be in the second state, continuously applies the second pulse voltage having a positive polarity at the second electrode with respect to the first electrode and the third pulse voltage having a positive polarity at the first electrode with respect to the second electrode to the variable-resistance nonvolatile memory element.

This method performs strong inversion negative forming using the second pulse voltage (strong inversion pulse) and the third pulse voltage (negative pulse) after applying the first pulse voltage. This can achieve small fluctuation of a negative forming voltage VLb as the amplitude of the third pulse voltage. Accordingly, a maximum value of the negative forming voltage VLb required for the negative forming of all bits of a memory cell array can be reduced, thereby achieving an improved reliability (retention characteristic). Moreover, a maximum value of the amplitude of the negative forming voltage VLb can be reduced, and thus forming can be performed in a practical voltage range, which makes it possible to omit a high voltage resistance transistor, thereby achieving a reduced area of the memory cell array.

In the forming method according to the embodiment described above, the conditioned pulse application may be repeated until the variable-resistance nonvolatile memory element is determined to be in the second state, and in the repetition, the second pulse voltage having an identical application time may be applied.

This method can reliably complete the negative forming of the variable-resistance nonvolatile memory element through the repetition of the conditioned pulse application.

In the forming method according to the embodiment described above, a plurality of conditioned pulse applications including a first conditioned pulse application and a second conditioned pulse application may be performed as the at least one conditioned pulse application, and the amplitude of the third pulse voltage in the second conditioned pulse application after the first conditioned pulse application may be larger than the amplitude of the third pulse voltage in the first conditioned pulse application.

This method allows for application of the third pulse voltage having a larger amplitude for a variable-resistance nonvolatile memory element not in the second state at each conditioned pulse application. Accordingly, a maximum value of the negative forming voltage VLb required for the negative forming of all bits of a memory cell array can be reduced, thereby achieving an improved reliability (retention characteristic). Moreover, a maximum value of the negative forming voltage VLb can be reduced, and thus forming can be performed in a practical voltage range, which makes it possible to omit a high voltage resistance transistor, thereby achieving a reduced area of the memory cell array.

In the forming method according to the embodiment described above, a plurality of conditioned pulse applications including a first conditioned pulse application and a second conditioned pulse application may be performed as the at least one conditioned pulse application, and the amplitude of the third pulse voltage in the second conditioned pulse application after the first conditioned pulse application may be equal to the amplitude of the third pulse voltage in the first conditioned pulse application.

This method allows for, application of the third pulse voltage having a fixed amplitude for a variable-resistance nonvolatile memory element not in the second state at each conditioned pulse application. Accordingly, the negative forming of all memory cells of the memory cell array can be performed using a simple device including no component for variably controlling the amplitude.

In the forming method according to the embodiment described above, a plurality of variable-resistance nonvolatile memory elements may be provided, each variable-resistance nonvolatile memory element including a first electrode, a second electrode, and a metal-oxide layer sandwiched between the first electrode and the second electrode. The variable-resistance nonvolatile memory element may change from a first state after manufacturing to a second state in which the variable-resistance nonvolatile memory element is reversibly changeable between a high resistance state and a low resistance state depending on a polarity of an applied pulse voltage. The variable-resistance nonvolatile memory element may have, in the first state, a resistance larger than a resistance in the high resistance state, and have, in the second state, a resistance that becomes low when a fourth pulse voltage having a positive polarity at the first electrode with respect to the second electrode is applied, and becomes high when a fifth pulse voltage having a positive polarity at the second electrode with respect to the first electrode is applied. The forming method may repeat the conditioned pulse application on a first variable-resistance nonvolatile memory element among the variable-resistance nonvolatile memory elements until the first variable-resistance nonvolatile memory element is determined to be in the second state, and may repeat the conditioned pulse application on a second variable-resistance nonvolatile memory element different from the first variable-nonvolatile memory element until the second variable-resistance nonvolatile memory element is determined to be in the second state after the repetition of the conditioned pulse application on the first variable-resistance nonvolatile memory element.

This method can complete the negative forming sequentially for the variable-resistance nonvolatile memory elements.

In the forming method according to the embodiment described above, a plurality of variable-resistance nonvolatile memory elements may be provided, each variable-resistance nonvolatile memory element including a first electrode, a second electrode, and a metal-oxide layer sandwiched between the first electrode and the second electrode. The variable-resistance nonvolatile memory element may change from a first state after manufacturing to a second state in which the variable-resistance nonvolatile memory element is reversibly changeable between a high resistance state and a low resistance state depending on a polarity of an applied pulse voltage. The variable-resistance nonvolatile memory element may have, in the first state, a resistance larger than a resistance in the high resistance state, and have, in the second state, a resistance that becomes low when a fourth pulse voltage having a positive polarity at the first electrode with respect to the second electrode is applied, and becomes high when a fifth pulse voltage having a positive polarity at the second electrode with respect to the first electrode is applied. The forming method may determine whether a first variable-resistance nonvolatile memory element among the variable-resistance nonvolatile memory elements is in the second state. If the first variable-resistance nonvolatile memory element is determined to be in the second state, the forming method may determine whether a second variable-resistance nonvolatile memory element different from the first variable-resistance nonvolatile memory element is in the second state. If the first variable-resistance nonvolatile memory element is determined not to be in the second state, the forming method may continuously apply the second pulse voltage and the third pulse voltage to the first variable-resistance nonvolatile memory element, and then determine whether the second variable-resistance nonvolatile memory element different from the first variable-resistance nonvolatile memory element is in the second state.

This method can perform the sequential determination of whether a plurality of variable-resistance nonvolatile memory elements are in the second state and the continuous application of the second pulse voltage and the third pulse voltage at each of a plurality of conditioned pulse applications.

The forming method according to the embodiment described above may determine whether the variable-resistance nonvolatile memory elements are all in the second state. If at least one of the variable-resistance nonvolatile memory elements is determined not to be in the second state, the forming method may perform a subsequent conditioned pulse application for each variable-resistance nonvolatile memory element.

The forming method according to the embodiment described above may determine whether the variable-resistance nonvolatile memory elements are all in the second state. If at least one of the variable-resistance nonvolatile memory elements is determined not to be in the second state, the forming method may perform a subsequent conditioned pulse application for each variable-resistance nonvolatile memory element, and at this subsequent conditioned pulse application, may apply, to each variable-resistance nonvolatile memory element, the third pulse voltage having an amplitude larger than the amplitude of the third pulse voltage applied to the variable-resistance nonvolatile memory element at one conditioned pulse application.

These methods allow for repetition of the conditioned pulse application until forming is complete for all variable-resistance nonvolatile memory elements.

The forming method according to the embodiment described above may apply another pulse voltage having a positive polarity at the second electrode with respect to the first electrode to the variable-resistance nonvolatile memory element or a plurality of the variable-resistance nonvolatile memory elements before application of the first pulse voltage.

This method achieves a reduced maximum value of the negative forming voltage VLb as the amplitude of the third pulse voltage.

In the forming method according to the embodiment described above, the metal-oxide layer may include a first metal-oxide layer in contact with the first electrode, and a second metal-oxide layer in contact with the second electrode and having an oxygen deficiency smaller than the first metal-oxide layer.

This method provides a favorable resistance change characteristic through the metal-oxide layer having a stack structure.

In the forming method according to the embodiment described above, the amplitude of the third pulse voltage may be equal to or larger than the amplitude of the first pulse voltage.

This method achieves a reduced maximum value of the negative forming voltage VLb as the amplitude of the third pulse voltage.

In the forming method according to the embodiment described above, the amplitude of the second pulse voltage may be larger than the amplitude of the fifth pulse voltage.

This method achieves a reduced maximum value of the negative forming voltage VLb as the amplitude of the third pulse voltage.

A variable-resistance nonvolatile memory device according to an embodiment of the present disclosure includes, a plurality of variable-resistance nonvolatile memory elements, a plurality of memory cells in each of which one of the variable-resistance nonvolatile memory elements and a switch element corresponding to this variable-resistance nonvolatile memory element are connected in series, a forming determination circuit that determines whether each variable-resistance nonvolatile memory element is in the second state, and a writing circuit that generates a pulse voltage for changing a resistance state of the variable-resistance nonvolatile memory element. The variable-resistance nonvolatile memory element includes a first electrode, a second electrode, and a metal-oxide layer sandwiched between the first electrode and the second electrode. The variable-resistance nonvolatile memory element changes, through forming, from a first state after manufacturing to a second state in which the variable-resistance nonvolatile memory element is reversibly changeable between a high resistance state and a low resistance state depending on a polarity of an applied pulse voltage. The variable-resistance nonvolatile memory element may have, in the first state, a resistance larger than a resistance in the high resistance state, and have, in the second state, a resistance that becomes low when a fourth pulse voltage having a positive polarity at the first electrode with respect to the second electrode is applied, and becomes high when a fifth pulse voltage having a positive polarity at the second electrode with respect to the first electrode is applied. The writing circuit applies a first pulse voltage having a positive polarity at the first electrode with respect to the second electrode to each variable-resistance nonvolatile memory element in the first state. The forming determination circuit and the writing circuit execute at least one conditioned pulse application on each variable-resistance nonvolatile memory element after the application of the first pulse voltage. In this conditioned pulse application, the forming determination circuit determines whether the variable-resistance nonvolatile memory element is in the second state. If the variable-resistance nonvolatile memory element is determined not to be in the second state, the writing circuit continuously applies the second pulse voltage having a positive polarity at the second electrode with respect to the first electrode and the third pulse voltage having a positive polarity at the first electrode with respect to the second electrode to the variable-resistance nonvolatile memory element.

With this configuration, strong inversion negative forming is performed using the second pulse voltage (strong inversion pulse) and the third pulse voltage (negative pulse) after the first pulse voltage is applied. This can achieve small fluctuation of the negative forming voltage VLb as the amplitude of the third pulse voltage. Accordingly, the negative forming voltage VLb required for the negative forming of all bits of a memory cell array can be reduced, thereby achieving an improved reliability (retention characteristic). Moreover, a maximum value of the negative forming voltage VLb can be reduced, and thus forming can be performed in a practical voltage range, which makes it possible to omit a high voltage resistance transistor, thereby achieving a reduced area of the memory cell array.

In the variable-resistance nonvolatile memory device according to the embodiment described above, the forming determination circuit and the writing circuit may repeat the conditioned pulse application until each variable-resistance nonvolatile memory elements is determined to be in the second state, and may apply the second pulse voltage having an identical application time in the repetition.

This configuration can reliably complete the negative forming of the variable-resistance nonvolatile memory element through the repetition of the conditioned pulse application.

In the variable-resistance nonvolatile memory device according to the embodiment described above, the writing circuit may execute, as the at least one conditioned pulse application, a plurality of conditioned pulse applications including a first conditioned pulse application and a second conditioned pulse application, and may apply the third pulse voltage having an amplitude larger than the amplitude of the third pulse voltage applied to the variable-resistance nonvolatile memory element in the first conditioned pulse application to the variable-resistance nonvolatile memory element at the second conditioned pulse application after the first conditioned pulse application.

With this configuration, the third pulse voltage having a larger amplitude for a variable-resistance nonvolatile memory element not in the second state can be applied at each conditioned pulse application. Accordingly, a maximum value of the negative forming voltage VLb required for the negative forming of all bits of a memory cell array can be reduced, thereby achieving an improved reliability (e.g., retention characteristic). Moreover, a maximum value of the amplitude of the negative forming voltage VLb can be reduced, and thus forming can be performed in a practical voltage range, which makes it possible to omit a high voltage resistance transistor, thereby achieving a reduced area of the memory cell array.

In the variable-resistance nonvolatile memory device according to the embodiment described above, the writing circuit may execute, as the at least one conditioned pulse application, a plurality of conditioned pulse applications including a first conditioned pulse application and a second conditioned pulse application, and at the second conditioned pulse application after the first conditioned pulse application, may apply, to the variable-resistance nonvolatile memory element, the third pulse voltage having an amplitude equal to the amplitude of the third pulse voltage applied to the variable-resistance nonvolatile memory element at the first conditioned pulse application.

With this configuration, the third pulse voltage having a fixed amplitude for a variable-resistance nonvolatile memory element not in the second state can be applied at each conditioned pulse application. Accordingly, the negative forming of all bits of the memory cell array can be performed using a simple device including no component for variably controlling the amplitude.

The variable-resistance nonvolatile memory device according to the embodiment described above may further include a reference current generation circuit. The forming determination circuit may compare a reference current output from the reference current generation circuit and a current flowing through each variable-resistance nonvolatile memory element to determine whether this variable-resistance nonvolatile memory element is in the second state based on a result of the comparison.

This configuration allows for reliable determination of whether each variable-resistance nonvolatile memory element is in the second state by the current comparison.

In the variable-resistance nonvolatile memory device according to the embodiment described above, the forming determination circuit and the writing circuit may repeat the conditioned pulse application on a first variable-resistance nonvolatile memory element among the variable-resistance nonvolatile memory elements until the first variable-resistance nonvolatile memory element is determined to be in the second state, and may repeat the conditioned pulse application on a second variable-resistance nonvolatile memory element different from the first variable-resistance nonvolatile memory element until the second variable-resistance nonvolatile memory element is determined to be in the second state after the repetition of the conditioned pulse application on the first variable-resistance nonvolatile memory element.

With this configuration, the negative forming can be completed sequentially for the variable-resistance nonvolatile memory elements.

In the variable-resistance nonvolatile memory device according to the embodiment described above, the forming determination circuit may determine whether a first variable-resistance nonvolatile memory element among the variable-resistance nonvolatile memory elements is in the second state at each conditioned pulse application. If the first variable-resistance nonvolatile memory element is determined to be in the second state, the forming determination circuit may determine whether a second variable-resistance nonvolatile memory element different from the first variable-resistance nonvolatile memory element is in the second state. If the first variable-resistance nonvolatile memory element is determined not to be in the second state, the writing circuit may continuously apply the second pulse voltage and the third pulse voltage to the first variable-resistance nonvolatile memory element, and thereafter, the forming determination circuit may determine whether the second variable-resistance nonvolatile memory element different from the first variable-resistance nonvolatile memory element is in the second state.

With this configuration, the sequential determination of whether a plurality of variable-resistance nonvolatile memory elements are in the second state and the continuous application of the second pulse voltage and the third pulse voltage can be performed at each of a plurality of conditioned pulse applications.

In the variable-resistance nonvolatile memory device according to the embodiment described above, after one of the conditioned pulse applications is executed, the forming determination circuit may determine whether the variable-resistance nonvolatile memory elements are all in the second state. If at least one of the variable-resistance nonvolatile memory elements is determined not to be in the second state, the forming determination circuit and the writing circuit may execute a subsequent conditioned pulse application.

In the variable-resistance nonvolatile memory device according to the embodiment described above, after one of the conditioned pulse applications is executed, the forming determination circuit may determine whether the variable-resistance nonvolatile memory elements are all in the second state. If at least one of the variable-resistance nonvolatile memory elements is determined not to be in the second state, the forming determination circuit and the writing circuit may execute a subsequent conditioned pulse application. At this subsequent conditioned pulse application, the writing circuit may apply, to each variable-resistance nonvolatile memory element, the fifth pulse voltage having an amplitude larger than the amplitude of the third pulse voltage applied to the variable-resistance nonvolatile memory element at the one conditioned pulse application.

With these configurations, the conditioned pulse application can be repeated until forming is complete for all variable-resistance nonvolatile memory elements.

In the variable-resistance nonvolatile memory device according to the embodiment described above, the writing circuit may apply another pulse voltage having a positive polarity at the second electrode with respect to the first electrode to each variable-resistance nonvolatile memory element before application of the first pulse voltage.

This method achieves a reduced maximum value of the negative forming voltage VLb as the amplitude of the third pulse voltage.

In the variable-resistance nonvolatile memory device according to the embodiment described above, the metal-oxide layer may include a first metal-oxide layer in contact with the first electrode, and a second metal-oxide layer in contact with the second electrode and having an oxygen deficiency smaller than the first metal-oxide layer.

With this configuration, a favorable resistance change characteristic can be easily obtained through the metal-oxide layer having a stack structure.

In the variable-resistance nonvolatile memory device according to the embodiment described above, the amplitude of the third pulse voltage may be equal to or larger than the amplitude of the first pulse voltage.

This configuration achieves a reduced maximum value of the negative forming voltage VLb as the amplitude of the third pulse voltage.

In the variable-resistance nonvolatile memory device according to the embodiment described above, the amplitude of the second pulse voltage may be larger than the amplitude of the fifth pulse voltage.

This configuration achieves a reduced maximum value of the negative forming voltage VLb as the amplitude of the third pulse voltage.

The embodiment is applicable to an IC card on which the variable-resistance nonvolatile memory device according to the embodiment described above is mounted.

With this configuration, an IC card having an improved reliability is achieved through the mounted variable-resistance nonvolatile memory device having an improved retention (data holding characteristic).

For example, the conditioned pulse application may be repeated on a first variable-resistance nonvolatile memory element among a plurality of variable-resistance nonvolatile memory elements provided to the variable-resistance nonvolatile memory device until the first variable-resistance nonvolatile memory element is determined to be in the second state, and the conditioned pulse application may be repeated on a second variable-resistance nonvolatile memory element different from the first variable-resistance nonvolatile memory element until the second variable-resistance nonvolatile memory element is determined to be in the second state after the repetition of the conditioned pulse application on the first variable-resistance nonvolatile memory element.

In this forming method and this variable-resistance nonvolatile memory device, for example, the forming processing illustrated in the flowchart in FIG. 1A is sequentially executed for each of a plurality of variable-resistance elements. Accordingly, the negative forming can be completed sequentially for the variable-resistance nonvolatile memory elements.

A variable-resistance nonvolatile memory device according to an embodiment of the present disclosure comprising: a variable-resistance nonvolatile memory element; and circuitry that selectively executes (A) applying a first pulse voltage to the variable-resistance nonvolatile memory element in a first state, the first pulse voltage having a first polarity, and (B) executing at least once a sequence that includes (b1) determining whether the variable-resistance nonvolatile memory element is in a second state, and (b2) continuously applying a second pulse voltage followed by a third pulse voltage to the variable-resistance nonvolatile memory element when the variable-resistance nonvolatile memory element is not in the second state, the second pulse voltage having a second polarity which is reverse to the first polarity, the third pulse voltage having the first polarity. The variable-resistance nonvolatile memory element is irreversibly changeable from the first state to the second state, a resistance value of the variable-resistance nonvolatile memory element being larger in the first state than in the second state. The variable-resistance nonvolatile memory element has, in the second state, such a reversible resistance change characteristic that the resistance value decreases in response to application of a fourth pulse voltage and increases in response to application of a fifth pulse voltage, the fourth pulse voltage having the first polarity, the fifth pulse voltage having the second polarity. An amplitude of the second pulse voltage is larger than an amplitude of the fifth pulse voltage.

The present disclosure is applicable to, for example, an electronic device or an IC card on which a variable-resistance nonvolatile memory element is mounted.

What is claimed is:

1. A forming method for a variable-resistance nonvolatile memory element, the forming method comprising:
   (A) applying a first pulse voltage to the variable-resistance nonvolatile memory element in a first state, the first pulse voltage having a first polarity; and
   (B) executing at least once a sequence that includes
     (b1) determining whether the variable-resistance nonvolatile memory element is in a second state, and
     (b2) continuously applying a second pulse voltage followed by a third pulse voltage to the variable-resistance nonvolatile memory element when the variable-resistance nonvolatile memory element is not in the second state, the second pulse voltage having a second polarity which is reverse to the first polarity, the third pulse voltage having the first polarity, wherein the variable-resistance nonvolatile memory element is irreversibly changeable from the first state to the second state, a resistance value of the variable-resistance nonvolatile memory element being larger in the first state than in the second state, the variable-resistance nonvolatile memory element has, in the second state, such a reversible resistance change characteristic that the resistance value decreases in response to application of a fourth pulse voltage and increases in response to application of a fifth pulse voltage, the fourth pulse voltage having the first polarity, the fifth pulse voltage having the second polarity, and an amplitude of the second pulse voltage is larger than an amplitude of the fifth pulse voltage.

2. The forming method according to claim 1, wherein the sequence is repeated until the variable-resistance nonvolatile memory element becomes in the second state.

3. The forming method according to claim 1, wherein the amplitude of the second pulse voltage is constant irrespective of the number of executions of the sequence.

4. The forming method according to claim 1, wherein the amplitude of the third pulse voltage is increased in accordance with the number of executions of the sequence.

5. The forming method according to claim 1, wherein an amplitude of the third pulse voltage is constant irrespective of the number of executions of the sequence.

6. The forming method according to claim 1, further comprising
applying another pulse voltage having the second polarity to the variable-resistance nonvolatile memory element in the first state before (A) the applying the first pulse voltage.

7. The forming method according to claim 1, wherein the variable-resistance nonvolatile memory element includes a first electrode, a second electrode, and a metal-oxide layer disposed between the first electrode and the second electrode.

8. The forming method according to claim 7, wherein the metal-oxide layer includes a first metal-oxide layer in contact with the first electrode and a second metal-oxide layer in contact with the second electrode, and
an oxygen deficiency of the second metal-oxide layer is smaller than an oxygen deficiency of the first metal-oxide layer.

9. The forming method according to claim 8, wherein the first polarity is a positive polarity at the first electrode with respect to the second electrode, and
the second polarity is a positive polarity at the second electrode with respect to the first electrode.

10. The forming method according to claim 1, wherein an amplitude of the third pulse voltage is not smaller than an amplitude of the first pulse voltage.

11. A forming method for variable-resistance nonvolatile memory elements, the forming method comprising:

(A) applying a first pulse voltage to each of the variable-resistance nonvolatile memory element in a first state, the first pulse voltage having a first polarity; and (B) executing at least once a sequence that includes (b1) determining whether a variable-resistance nonvolatile memory element selected from among the variable-resistance nonvolatile memory elements is in a second state, and (b2) continuously applying a second pulse voltage followed by a third pulse voltage to the selected variable-resistance nonvolatile memory element when the selected variable-resistance nonvolatile memory element is not in the second state, the second pulse voltage having a second polarity which is reverse to the first polarity, the third pulse voltage having the first polarity, wherein each of the variable-resistance nonvolatile memory elements is irreversibly changeable from the first state to the second state, a resistance value of each of the variable-resistance nonvolatile memory elements being larger in the first state than in the second state, each of the variable-resistance nonvolatile memory elements has, in the second state, such a reversible resistance change characteristic that the resistance value decreases in response to application of a fourth pulse voltage and increases in response to application of a fifth pulse voltage, the fourth pulse voltage having the first polarity, the fifth pulse voltage having the second polarity, and an amplitude of the second pulse voltage is larger than an amplitude of the fifth pulse voltage.

12. The forming method according to claim 11, wherein the sequence is repeated until the selected variable-resistance nonvolatile memory element becomes in the second state.

13. The forming method according to claim 11, wherein after the selected variable-resistance nonvolatile memory element becomes in the second state, a variable-resistance nonvolatile memory element is newly selected from among the variable-resistance nonvolatile memory elements, and the sequence is executed on the newly selected variable-resistance nonvolatile memory element.

14. The forming method according to claim 11, wherein every after the sequence is executed once, a variable-resistance nonvolatile memory element is newly selected from among the variable-resistance nonvolatile memory elements, and the sequence is executed on the newly selected variable-resistance nonvolatile memory element.

15. The forming method according to claim 14, further comprising:

(C) determining whether the variable-resistance nonvolatile memory elements are all in the second state, after the sequence is executed on all of the variable-resistance nonvolatile memory elements, and (D) when at least one of the variable-resistance nonvolatile memory elements is not in the second state, executing the sequence again on a variable-resistance nonvolatile memory element selected from among the at least one variable-resistance nonvolatile memory element.

16. The forming method according to claim 15, wherein an amplitude of the third pulse voltage is increased in accordance with the number of applications of the third pulse voltage to the selected variable-resistance nonvolatile memory element.

* * * * *